US010511290B2

(12) United States Patent
Asao et al.

(10) Patent No.: US 10,511,290 B2
(45) Date of Patent: Dec. 17, 2019

(54) SINE-WAVE MULTIPLIER AND INPUT DEVICE INCLUDING THE SAME

(71) Applicant: ALPS ALPINE CO., LTD., Tokyo (JP)

(72) Inventors: Akira Asao, Miyagi (JP); Kiyoshi Sasai, Miyagi (JP); Tatsumi Fujiyoshi, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 140 days.

(21) Appl. No.: 15/950,327

(22) Filed: Apr. 11, 2018

(65) Prior Publication Data
US 2018/0234085 A1 Aug. 16, 2018

Related U.S. Application Data

(63) Continuation of application No. PCT/JP2016/080397, filed on Oct. 13, 2016.

(30) Foreign Application Priority Data

Oct. 16, 2015 (JP) .................................. 2015-205125

(51) Int. Cl.
H03K 3/012 (2006.01)
G06F 7/16 (2006.01)
(Continued)

(52) U.S. Cl.
CPC .............. H03K 3/012 (2013.01); G06F 1/02 (2013.01); G06F 3/044 (2013.01); G06F 3/0416 (2013.01);
(Continued)

(58) Field of Classification Search
CPC ...... H03K 3/012; H03K 5/00006; G06F 1/02; G06F 3/044; G06F 3/0416; G06F 7/16; G06G 7/16
See application file for complete search history.

(56) References Cited

U.S. PATENT DOCUMENTS 4,295,105 A 10/1981 Bingham
6,560,451 B1 5/2003 Somayajula
(Continued)

FOREIGN PATENT DOCUMENTS

EP 1959562 8/2008
JP S47-026229 7/1972
(Continued)

OTHER PUBLICATIONS

Extended European Search Report for 16855474.9 dated Sep. 25, 2018.
(Continued)

Primary Examiner — Jeffrey M Shin
(74) Attorney, Agent, or Firm — IPUSA, PLLC

(57) ABSTRACT

In a sine-wave multiplier, signal components included in an output signal Qu1 and corresponding to the product of a third-order harmonic component of a first square wave W1 and an input signal Vi and the product of a fifth-order harmonic component of the first square wave W1 and the input signal Vi are offset by a signal component included in an output signal Qu2 and corresponding to the product of a fundamental component of a second square wave W2 and the input signal Vi and a signal component included in an output signal Qu3 and corresponding to the product of a fundamental component of a second square wave W3 and the input signal Vi.

9 Claims, 13 Drawing Sheets

(51) Int. Cl.
  *G06G 7/16*      (2006.01)
  *G06F 1/02*      (2006.01)
  *G06F 3/041*     (2006.01)
  *G06F 3/044*     (2006.01)
  *H03K 5/00*      (2006.01)

(52) U.S. Cl.
  CPC ............... *G06F 7/16* (2013.01); *G06G 7/16* (2013.01); *H03K 5/00006* (2013.01)

(56) References Cited

U.S. PATENT DOCUMENTS

| | | | |
|---|---|---|---|
| 9,735,894 B2 * | 8/2017 | Alam | H03D 7/1441 |
| 2006/0040634 A1 | 2/2006 | Wang | |
| 2008/0194222 A1 * | 8/2008 | Liu | H03D 7/1441 |
| | | | 455/296 |
| 2010/0283526 A1 * | 11/2010 | Van Sinderen | H03D 7/1441 |
| | | | 327/361 |
| 2011/0006849 A1 * | 1/2011 | Lee | H03D 7/18 |
| | | | 331/43 |

FOREIGN PATENT DOCUMENTS

| | | |
|---|---|---|
| JP | 2000-315919 | 11/2000 |
| JP | 2005-143804 | 6/2005 |
| WO | 2012/148539 | 11/2012 |

OTHER PUBLICATIONS

International Search Report dated Dec. 27, 2016 in PCT/JP2016/080397 filed on Oct. 13, 2016.

* cited by examiner

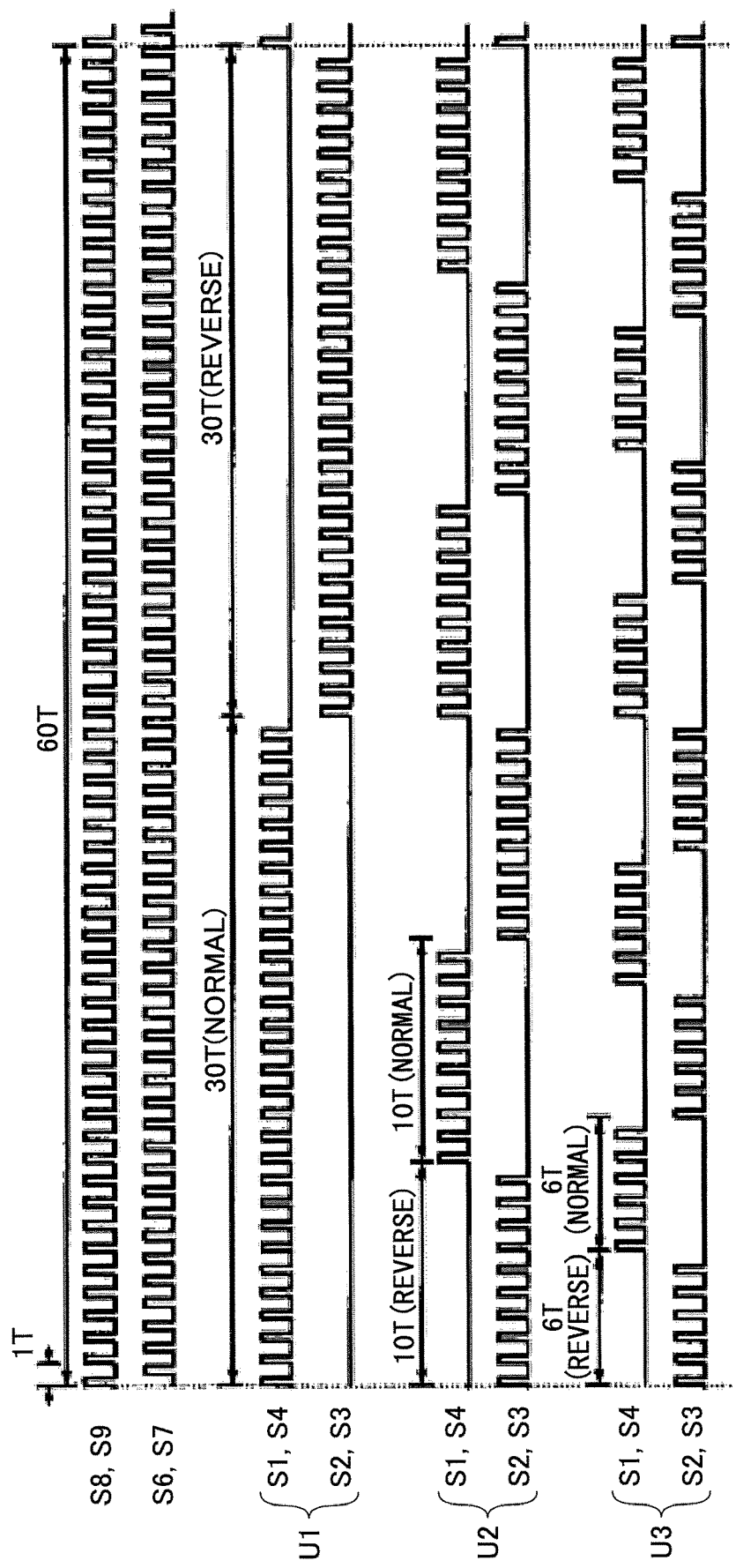

10,511,290 B2

SINE-WAVE MULTIPLIER AND INPUT DEVICE INCLUDING THE SAME

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2016/080397, filed on Oct. 13, 2016, which is based on and claims the benefit of priority of Japanese Patent Application No. 2015-205125 filed on Oct. 16, 2015, the entire contents of which are incorporated herein by reference.

BACKGROUND OF THE INVENTION

1. Field of the Invention

An aspect of this disclosure relates to a sine-wave multiplier and an input device including the sine-wave multiplier.

2. Description of the Related Art

An analog multiplier such as a Gilbert cell is generally used to multiply an input signal by a sine wave (see, for example, Japanese Laid-Open Patent Publication No. 2000-315919).

A Gilbert-cell analog multiplier is implemented by, for example, a configuration as illustrated in FIG. 1 of Japanese Laid-Open Patent Publication No. 2000-315919. When a Gilbert cell is formed using bipolar transistors, the multiplication result includes a thermal voltage VT as a coefficient as indicated by formula (14) and formula (20) in Japanese Laid-Open Patent Publication No. 2000-315919. The thermal voltage VT is represented by "k·T/q", where k indicates a Boltzmann constant, T indicates an absolute temperature, and q indicates elementary charge of electrons. Accordingly, the multiplication result or the output voltage of the Gilbert cell varies depending on the temperature. The same applies to other types of analog multipliers formed using MOS transistors. Also, with an analog multiplier, due to the nonlinearity of input-output characteristics of transistors, it is necessary to limit the input voltage range to achieve multiplication accuracy. For the reasons discussed above, when an analog multiplier is used in, for example, a capacitance input device, it is difficult to maintain the dynamic range of signals and to cope with temperature variations.

Also, when sine-wave multiplication is performed using an analog multiplier, a sine wave needs to be generated using a separate circuit. For example, to accurately extract a signal by multiplying an input signal by a sine wave, it is necessary to generate an accurate sine wave. This in turn increases the size of a circuit for generating a sine wave and increases the power consumption.

SUMMARY OF THE INVENTION

An aspect of this disclosure provides a sine-wave multiplier that multiplies an input signal by a sine wave with a predetermined frequency. The sine-wave multiplier includes a first input terminal and a second input terminal to which the input signal is input, square-wave multipliers that multiply the input signal by square waves with different frequencies, and a signal combiner that combines the multiplied input signals output from the square-wave multipliers. Each square wave is approximated by the sum of a fundamental component that is a sine wave with the lowest frequency and multiple harmonic components that are sine waves with frequencies that are integral multiples of the frequency of the fundamental component. The square-wave multipliers include a first square-wave multiplier that multiplies the input signal by a first square wave including a fundamental component that is the sine wave with the predetermined frequency, and at least one second square-wave multiplier that multiplies the input signal by a second square wave including a fundamental component that is a sine wave corresponding to one of harmonic components of the first square wave or a sine wave obtained by inverting the phase of the one of the harmonic components. The signal combiner offsets a signal component that is included in a multiplication result of the first square-wave multiplier and corresponds to a product of the input signal and the one of the harmonic components of the first square wave by a signal component that is included in a multiplication result of the second square-wave multiplier and corresponds to a product of the input signal and the fundamental component of the second square wave. Each of the square-wave multipliers includes two capacitors having the same capacitance and is configured to alternately repeat, at predetermined intervals, a charging process where charges having a difference corresponding to the input signal are stored in the two capacitors in each of a first half cycle and a second half cycle of each cycle of the square wave for multiplying the input signal and a charge output process where the charges stored in the two capacitors by the charging process are output to the signal combiner, and to invert, between the first half cycle and the second half cycle, a relationship between a polarity of the input signal in the charging process and a polarity of a difference between the charges output from the two capacitors to the signal combiner in the charge output process. The signal combiner is configured to combine the charges that are output from multiple sets of the two capacitors of the square-wave multipliers in the charge output process.

BRIEF DESCRIPTION OF THE DRAWINGS

FIG. 7 is a timing chart illustrating states of switch elements of a sine-wave multiplier according to the second embodiment;

DESCRIPTION OF THE PREFERRED EMBODIMENTS

One object of the present invention is to provide a sine-wave multiplier that has a simple configuration, can handle a wide range of input signal levels, and is less influenced by temperature variations.

Embodiments of the present invention are described below with reference to the accompanying drawings.

First, an outline of a method of multiplying an input signal by a sine wave by a sine-wave multiplier of an embodiment of the present invention is described.

Figure 1A:
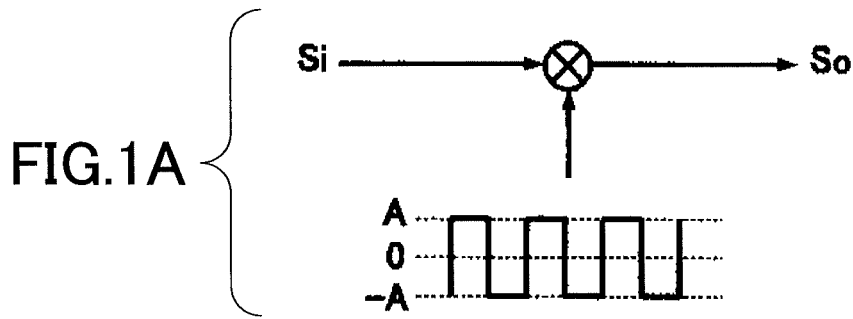
FIGS. 1A and 1B are drawings illustrating an exemplary configuration of a circuit that multiplies an input signal by a square wave.
Figure 1B:
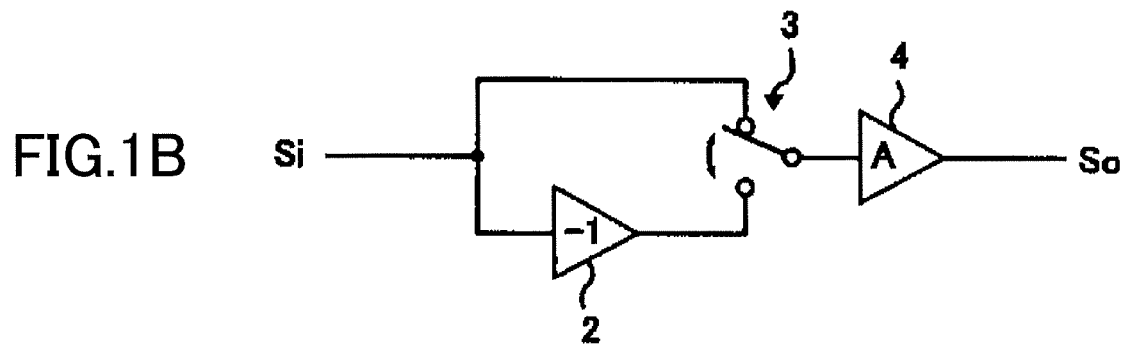

FIGS. 1A and 1B are drawings illustrating an exemplary configuration of a circuit that multiplies an input signal Si by a square wave. Unlike multiplication by a sine wave, multiplication by a square wave can be performed with a simple circuit including fixed-gain amplifier circuits 2 and 4 and a switch circuit 3 as illustrated by FIG. 1B. In the square-wave multiplication circuit illustrated by FIG. 1B, the input signal Si or a signal obtained by inverting the input signal Si by the amplifier circuit 2 with a gain "−1" is input via the switch circuit 3 to the amplifier circuit 4 with a gain A. In a half cycle of a square wave, the input signal Si is amplified by the amplifier circuit 4 with the gain A (i.e., multiplied by A); and in the other half cycle of the square wave, the input signal Si is amplified by the amplifier circuit 4 with the gain A and by the amplifier circuit 2 with the gain "−1" (i.e., multiplied by −A).

Figure 2A:
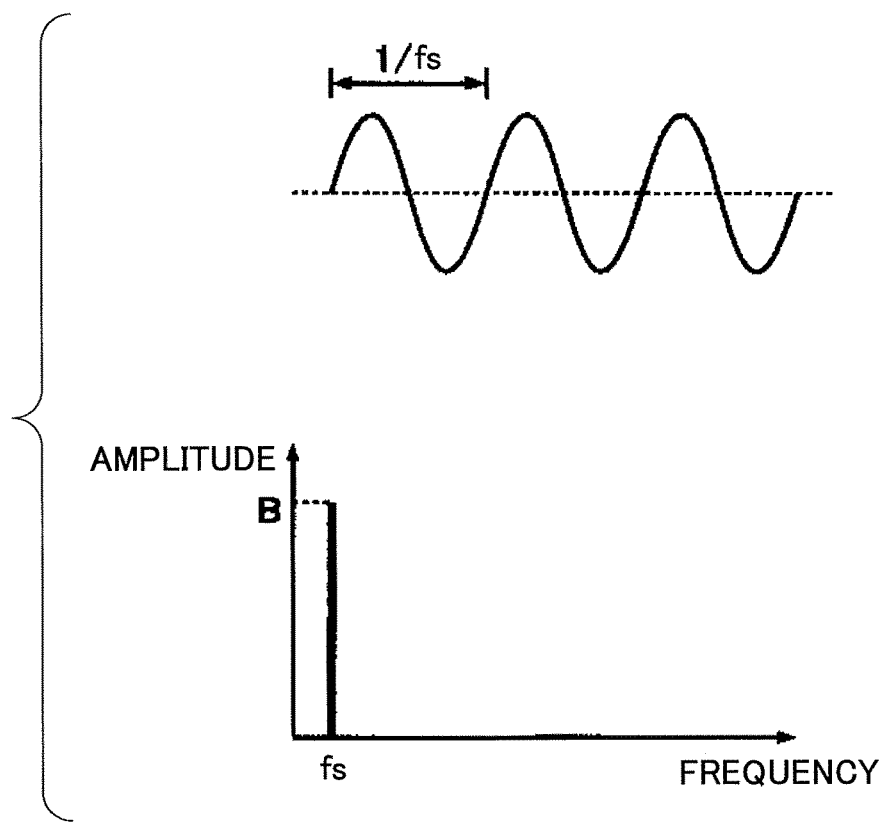
FIG. 2A is a drawing illustrating a frequency component of a sine wave.
Figure 2B:
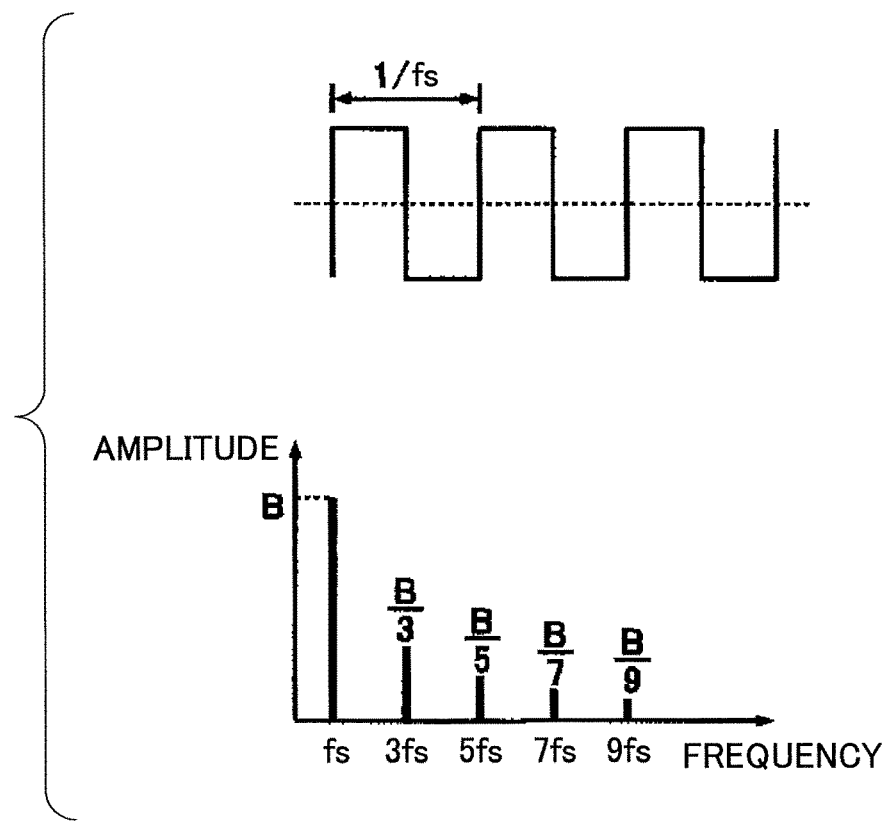
FIG. 2B is a drawing illustrating components of a square wave.

FIGS. 2A and 2B are drawings illustrating frequency components of a sine wave and a square wave. As illustrated in FIG. 2A, the sine wave includes only a single frequency component. In contrast, as illustrated in FIG. 2B, the square wave includes a fundamental component and harmonic components. Accordingly, a signal obtained by multiplying the input signal Si by the square wave illustrated in FIG. 1A includes a signal component obtained by multiplying the input signal Si by the fundamental component (input signal Si×fundamental component) and signal components obtained by multiplying the input signal Si by the harmonic components (input signal Si×harmonic components).

As illustrated by FIG. 1B, multiplication by a square wave can be performed with a simple circuit configuration, and is less likely affected by temperature characteristics and input-output nonlinear characteristics of transistors compared with a case where an analog multiplier is used. However, because a signal obtained by multiplying the input signal Si by a square wave includes harmonic signal components (input signal Si×harmonic components) as described above, the signal cannot be used without change as a result of multiplying the input signal Si by a sine wave. For this reason, in a sine-wave multiplier of the present embodiment, multiple circuits for multiplying an input signal by square waves are provided, and outputs from the multiple circuits are combined to cancel unnecessary signal components (input signal×harmonic components) included in the results of multiplying the input signal by the square waves.

Figure 3:
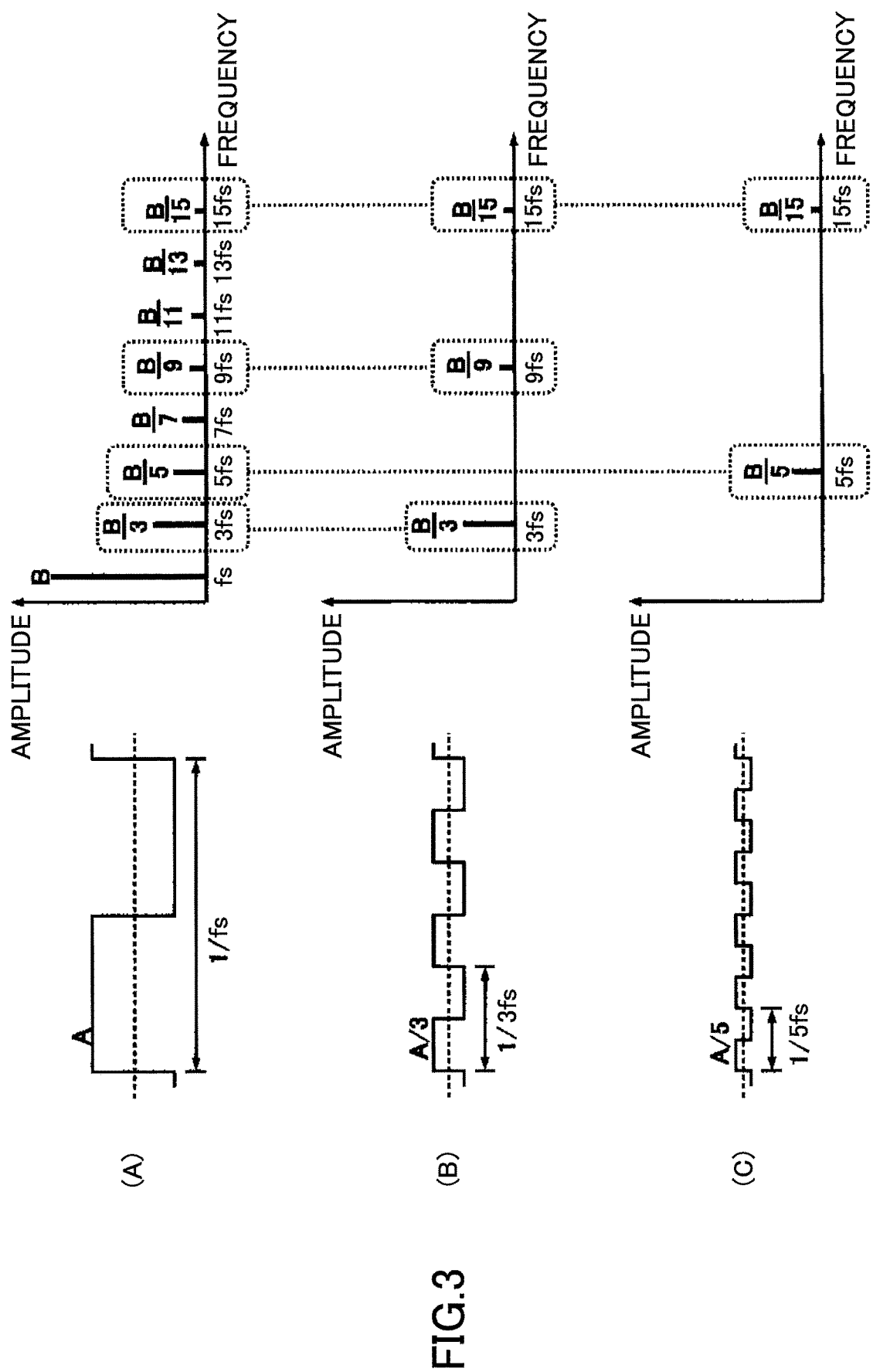
FIG. 3 is a drawing illustrating frequency components of square waves.

FIG. 3 is a drawing illustrating frequency components of square waves. FIG. 3 (A) illustrates frequency components of a square wave with a frequency fs. FIG. 3 (B) illustrates frequency components of a square wave having a frequency (3fs) that is three times higher than the frequency fs of the square wave in FIG. 3 (A) and having an amplitude (A/3) that is one third of a frequency A of the square wave in FIG. 3 (A). FIG. 3 (C) illustrates frequency components of a square wave having a frequency (5fs) that is five times higher than the frequency fs of the square wave in FIG. 3 (A) and having an amplitude (A/5) that is one fifth of the frequency A of the square wave in FIG. 3 (A).

The square wave with the frequency fs includes a fundamental component with the frequency fs and harmonic components with frequencies (3fs, 5fs, 7fs, . . . ) that are odd multiples of the frequency fs. When "B" indicates the amplitude of the fundamental component, the amplitude of a harmonic component with a frequency "K×fs" (which is hereafter referred to as a "Kth-order harmonic component") is represented by "B/K". The fundamental component of a square wave with a frequency 3fs and an amplitude B/3 illustrated in FIG. 3 (B) is the same as the third-order harmonic component of the square wave having the frequency fs and the amplitude B illustrated in FIG. 3 (A). The fundamental component of a square wave with a frequency 5fs and an amplitude B/5 illustrated in FIG. 3 (C) is the same as the fifth-order harmonic component of the square wave having the frequency fs and the amplitude B illustrated in FIG. 3 (A).

Accordingly, it is possible to cancel the third-order harmonic component and the fifth-order harmonic component in the square wave with the frequency fs by multiplying the input signal Si by the square wave of FIG. 3 (A), multiplying the input signal Si by an antiphase square wave of the square wave of FIG. 3 (B), multiplying the input signal Si by an antiphase square wave of the square wave of FIG. 3 (C), and combining the multiplication results. Thus, in a sine-wave multiplier of the present embodiment, instead of directly multiplying an input signal and a sine wave using an analog multiplier, multiplication of the input signal and the sine wave is achieved by multiplying the input signal by multiple square waves and by combining the multiplication results. This configuration makes it possible to simplify the circuit configuration for sine-wave multiplication and to reduce the influence of temperature characteristics and input-output nonlinear characteristics of transistors on the sine-wave multiplication.

Next, embodiments of the present invention are described with reference to the accompanying drawings.

First Embodiment

Figure 4:
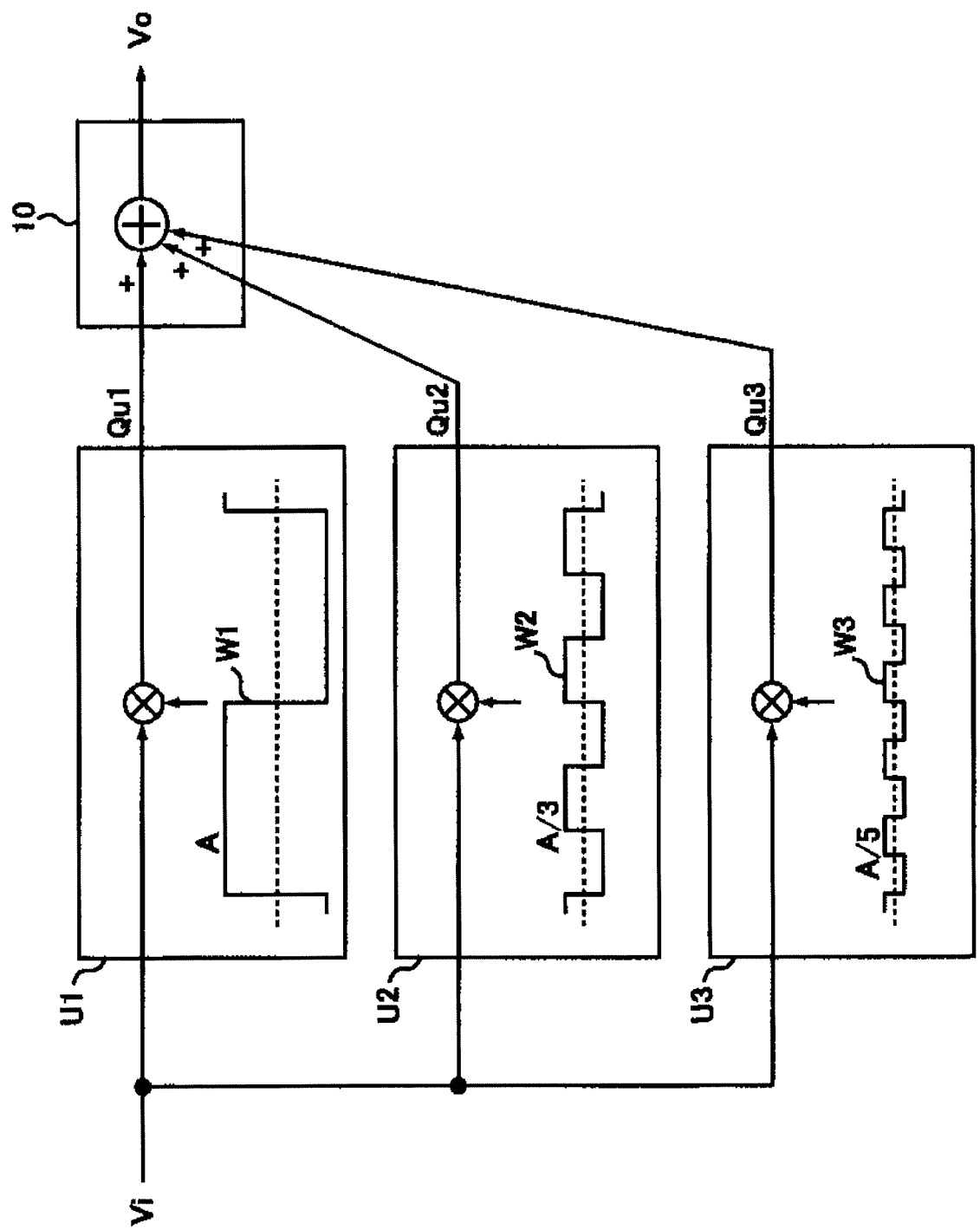
FIG. 4 is a drawing illustrating an example of a configuration of a sine-wave multiplier according to a first embodiment.

FIG. 4 is a drawing illustrating an example of a configuration of a sine-wave multiplier according to a first embodiment. The sine-wave multiplier of FIG. 4 includes three square-wave multipliers U1, U2, and U3 that multiply an input signal Vi by square waves W1, W2, and W3 with different frequencies, respectively, and a signal combiner 10 that combines output signals Qu1, Qu2, and Qu3 output from the square-wave multipliers U1, U2, and U3. Hereafter, a given one of the square-wave multipliers U1 through U3 may be referred to as a "square-wave multiplier U", a given one of the output signals Qu1 through Qu3 may be referred to as an "output signal Qu", and a given one of the square waves W1 through W3 may be referred to as a "square wave W".

The square wave W used by the square-wave multiplier U to multiply the input signal Vi has such a waveform that the square wave W has the same amplitude and opposite polarities in the first and second half cycles. The square wave W can be approximated by a sum of a fundamental component and harmonic components as illustrated in FIGS. 2A and 2B and FIG. 3. A Kth-order harmonic component has a frequency that is K times higher than the frequency of the fundamental component and an amplitude that is one Kth of the amplitude of the fundamental component.

For example, the square-wave multiplier U generates an output signal Qu that is proportional to the input signal Vi in each of the first half cycle and the second half cycle in one cycle of the square wave W used to multiply the input signal Vi, and generates the output signal Qu such that the absolute value of a ratio between the input signal Vi and the output signal Qu becomes the same in the first half cycle and the second half cycle and the ratio has opposite signs in the first half cycle and the second half cycle. That is, the square-wave multiplier U generates the output signal Qu such that the ratio of the output signal Qu to the input signal Vi in the first half cycle of the square wave W becomes "A", and the ratio of the output signal Qu to the input signal Vi in the second half cycle of the square wave W becomes "−A".

The square-wave multiplier U1 (which is hereafter referred to as a "first square-wave multiplier U1") multiplies the input signal Vi by a square wave W1 (which is hereafter referred to as a "first square wave W1") that includes a sine wave with a frequency fs as the fundamental component. In the example of FIG. 4, the frequency of the first square wave W1 is "fs" and the amplitude of the first square wave W1 is "A".

The square-wave multipliers U2 and U3 (which are hereafter referred to as a "second square-wave multiplier U2" and a "second square-wave multiplier U3), respectively, multiply the input signal Vi by square waves W2 and W3 (which are hereafter referred to as a "second square wave W2" and a "second square wave W3") each of which includes a sine wave obtained by inverting the phase of a harmonic component in the first square wave W1 with the frequency fs as the fundamental component.

That is, the second square-wave multiplier U2 multiplies the input signal Vi by the second square wave W2 that includes a sine wave obtained by inverting the phase of a third-order harmonic component in the first square wave W1 as the fundamental component. As illustrated in FIG. 4, the frequency of the second square wave W2 is "3fs" and the amplitude of the second square wave W2 is "A/3".

Also, the second square-wave multiplier U3 multiplies the input signal Vi by the second square wave W3 that includes a sine wave obtained by inverting the phase of a fifth-order harmonic component in the first square wave W1 as the fundamental component. As illustrated in FIG. 4, the frequency of the second square wave W3 is "5fs" and the amplitude of the second square wave W3 is "A/5".

The signal combiner 10 adds up the output signal Qu1 from the first square-wave multiplier U1 and the output signals Qu2 and Qu3 from the second square-wave multipliers U2 and U3. By adding the output signals Qu1 through Qu3 together, the signal combiner 10 offsets a signal component included in the output signal Qu1 and corresponding to the product of the third-order harmonic component of the first square wave W1 and the input signal Vi by a signal component included in the output signal Qu2 and corresponding to the product of the fundamental component of the second square wave W2 and the input signal Vi. Also, the signal combiner 10 offsets a signal component included in the output signal Qu1 and corresponding to the product of the fifth-order harmonic component of the first square wave W1 and the input signal Vi by a signal component included in the output signal Qu3 and corresponding to the product of the fundamental component of the second square wave W3 and the input signal Vi.

Thus, with the sine-wave multiplier illustrated by FIG. 4, the signal components included in the output signal Qu1 and corresponding to the product of the third-order harmonic component of the first square wave W1 and the input signal Vi and the product of the fifth-order harmonic component of the first square wave W1 and the input signal Vi are offset by the signal component included in the output signal Qu2 and corresponding to the product of the fundamental component of the second square wave W2 and the input signal Vi and the signal component included in the output signal Qu3 and corresponding to the product of the fundamental component of the second square wave W3 and the input signal Vi. As a result, in an output signal Vo obtained by combining the output signals Qu1 through Qu3, signal components corresponding to the third-order harmonic component and the fifth-order harmonic component of the first square wave W1 decrease, and a signal component corresponding to the product of the fundamental component (the sine wave with the frequency fs) of the first square wave W1 and the input signal Vi becomes dominant. Accordingly, the sine-wave multiplier can generate the output signal Vo corresponding to the product of the sine wave with the frequency fs and the input signal Vi.

Also, in the sine-wave multiplier illustrated by FIG. 4, the square-wave multiplier U generates the output signal Qu such that the absolute value of a ratio between the input signal Vi and the output signal Qu becomes the same in the first half cycle and the second half cycle in each cycle of the square wave W by which the input signal Vi is multiplied and the ratio has opposite signs in the first half cycle and the second half cycle. That is, the input signal Vi is multiplied by the square wave W by inverting the sign of the ratio (signal gain) of the output signal Qu to the input signal Vi every half cycle of the square wave W while maintaining the absolute value of the ratio constant. The multiplication by the square wave W described above is discrete signal processing where fixed signal gains are switched every half cycle, and therefore the influence of analog characteristics of transistor currents and voltages on the multiplication result is small. Accordingly, compared with a case where an analog multiplier is used, the above configuration makes it possible to reduce the influence of temperature characteristics and input-output nonlinear characteristics of transistors on multiplication results.

Second Embodiment

Next, an example of a more detailed configuration of the sine-wave multiplier of FIG. 4 according to a second embodiment is described.

Figure 5:
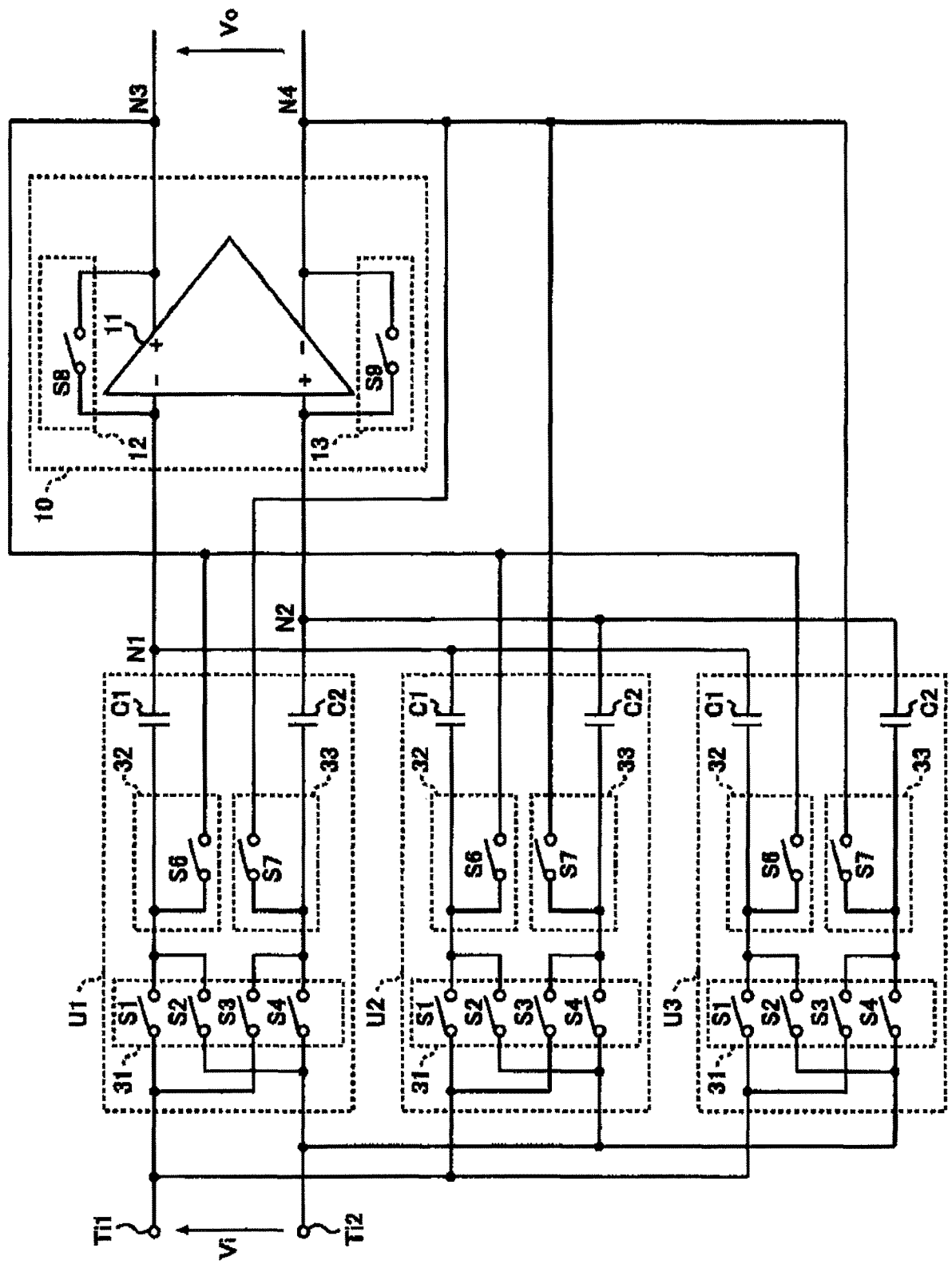
FIG. 5 is a drawing illustrating an example of a configuration of a sine-wave multiplier according to a second embodiment.

FIG. 5 is a drawing illustrating an example of a configuration of a sine-wave multiplier according to the second embodiment. The sine-wave multiplier of FIG. 5 includes a first square-wave multiplier U1 that multiplies an input signal Vi by a first square wave W1, second square-wave multipliers U2 and U3 that multiply the input signal Vi by square waves W2 and W3, and a signal combiner 10 that combines multiplication result signals from the first square-wave multiplier U1 and the second square-wave multipliers U2 and U3.

The sine-wave multiplier of the second embodiment also includes a first input terminal Ti1 and a second input terminal Ti2 to which a differential signal is input as the input signal Vi; and a first common node N1, a second common node N2, a third common node N3, and a fourth common node N4 to which the three square-wave multipliers (U1 through U3) are commonly connected.

Each square-wave multiplier U includes two capacitors (a first capacitor C1 and a second capacitor C2) having the same capacitance. In each of a first half cycle and a second half cycle in each cycle of a square wave (the first square wave or one of the second square waves) for multiplying the input signal Vi, the square-wave multiplier U alternately repeats, at predetermined intervals, a charging process for storing charges corresponding to the input signal Vi in the capacitors (C1 and C2) and a charge output process for outputting the charges stored in the capacitors (C1 and C2) by the charging process to the signal combiner 10. Also, the square-wave multiplier U inverts, between the first half cycle and the second half cycle in each cycle of the square wave, the relationship between the polarity of the input signal Vi in the charging process and the polarity of a difference between the charges output from the two capacitors (C1 and C2) to the signal combiner 10 in the charge output process. For example, when the polarity of the input signal Vi is "positive", the polarity of a difference between the charges output from the two capacitors (C1 and C2) to the signal combiner 10 is set to "positive" in the first half cycle of the square wave and is set to "negative" in the second half cycle of the square wave. The square-wave multiplier U multiplies the input signal Vi by a square wave (the first square wave or one of the second square waves) by inverting the polarity every half cycle as described above.

For example, in the charging process, the square-wave multiplier U applies a voltage generated between one of the first input terminal Ti1 and the second input terminal Ti2 and the first common node N1 to the first capacitor C1, and applies a voltage generated between another one of the first input terminal Ti1 and the second input terminal Ti2 and the second common node N2 to the second capacitor C2. In the charge output process, the square-wave multiplier U connects the first capacitor C1 to a point between the first common node N1 and the third common node N3 and connects the second capacitor C2 to a point between the second common node N2 and the fourth common node N4.

Also, the square-wave multiplier U inverts, between the first half cycle and the second half cycle in each cycle of the square wave, the relationship between the polarity of the input signal Vi during the charging process and the polarity of a charge difference obtained by subtracting a charge stored in the second capacitor C2 during the charging process from a charge stored in the first capacitor C1.

In the example of FIG. 5, the square-wave multiplier U includes the first capacitor C1 and the second capacitor C2 having the same capacitance, a first switch circuit 31, a second switch circuit 32, and a third switch circuit 33.

A first terminal of the first capacitor C1 is connected to the first common node N1, and a second terminal of the first capacitor C1 is connected via the first switch circuit 31 to the first input terminal Ti1 or the second input terminal Ti2.

A first terminal of the second capacitor C2 is connected to the second common node N2, and a second terminal of the second capacitor C2 is connected via the first switch circuit 31 to the first input terminal Ti1 or the second input terminal Ti2.

In the charging process during the first half cycle of each cycle of the first square wave W1 for multiplying the input signal Vi, the first switch circuit 31 connects the second terminal of the first capacitor C1 to the first input terminal Ti1 and connects the second terminal of the second capacitor C2 to the second input terminal Ti2. Also, in the charging process during the second half cycle of each cycle of the first square wave W1, the first switch circuit 31 connects the second terminal of the first capacitor C1 to the second input terminal Ti2 and connects the second terminal of the second capacitor C2 to the first input terminal Ti1. In the charge output process, the first switch circuit 31 disconnects the second terminal of the first capacitor C1 and the second terminal of the second capacitor C2 from the first input terminal Ti1 and the second input terminal Ti2.

As exemplified by FIG. 5, the first switch circuit 31 includes four switch elements (S1 through S4). The switch element S1 is provided in a path between the second terminal of the first capacitor C1 and the first input terminal Ti1. The switch element S2 is provided in a path between the second terminal of the first capacitor C1 and the second input terminal Ti2. The switch element S3 is provided in a path between the second terminal of the second capacitor C2 and the first input terminal Ti1. The switch element S4 is provided in a path between the second terminal of the second capacitor C2 and the second input terminal Ti2. In the charging process during the first half cycle in each cycle of the first square wave W1, the switch elements S1 and S4 are turned on and the switch elements S2 and S3 are turned off. In the charging process during the second half cycle in each cycle of the first square wave W1, the switch elements S1 and S4 are turned off and the switch elements S2 and S3 are turned on. In the charge output process, all of the switch elements S1 through S4 are turned off.

The second switch circuit 32 is provided in a path between the second terminal of the first capacitor C1 and the third common node N3. The second switch circuit 32 is turned off in the charging process and is turned on in the charge output process of the square-wave multiplier U. In the example of FIG. 5, the second switch circuit 32 includes a switch element S6 connected between the second terminal of the first capacitor C1 and the third common node N3.

The third switch circuit 33 is provided in a path between the second terminal of the second capacitor C2 and the fourth common node N4. The third switch circuit 33 is turned off in the charging process and is turned on in the charge output process of the square-wave multiplier U. In the example of FIG. 5, the third switch circuit 33 includes a switch element S7 connected between the second terminal of the second capacitor C2 and the fourth common node N4.

The second square-wave multipliers U2 and U3 have a configuration similar to that of the first square-wave multiplier U1. However, the capacitance of the first capacitor C1 and the capacitance of the second capacitor C2 in the first square-wave multiplier U1 and the second square-wave multipliers U2 and U3 are set such that harmonic components of the first square wave W1 have amplitudes that are the same as the amplitudes of fundamental components of the second square waves W2 and W3

That is, the capacitance of the capacitors (C1 and C2) in the second square-wave multiplier U2 is set at one third of the capacitance of the capacitors (C1 and C2) in the first square-wave multiplier U1. This ratio in capacitance is the same as the ratio between the amplitude of the fundamental component of the first square wave W1 and the amplitude of the third-order harmonic component of the first square wave W1 having a frequency (3fs) that is the same as the frequency of the fundamental component of the second square wave W2. When the capacitance becomes one third, the amount of charge for the same voltage becomes one third. Accordingly, the amplitude of the second square wave W2 used by the second square-wave multiplier U2 to multiply the input signal Vi becomes one third of the amplitude of the first square wave W1.

Also, the capacitance of the capacitors (C1 and C2) in the second square-wave multiplier U3 is set at one fifth of the capacitance of the capacitors (C1 and C2) in the first square-wave multiplier U1. This ratio in capacitance is the same as the ratio between the amplitude of the fundamental component of the first square wave W1 and the amplitude of the fifth-order harmonic component of the first square wave W1 having a frequency (5fs) that is the same as the frequency of the fundamental component of the second square wave W3. When the capacitance becomes one fifth, the amount of charge for the same voltage becomes one fifth. Accordingly, the amplitude of the second square wave W3 used by the second square-wave multiplier U3 to multiply the input signal Vi becomes one fifth of the amplitude of the first square wave W1.

When "Cu1" indicates the capacitance of the first capacitor C1 and the second capacitor C2 in the first square-wave multiplier U1, "Cu2" indicates the capacitance of the first capacitor C1 and the second capacitor C2 in the second square-wave multiplier U2, and "Cu3" indicates the capacitance of the first capacitor C1 and the second capacitor C2 in the second square-wave multiplier U3, the capacitance of these capacitors is set as indicated by the following formula.

$$Cu1:Cu2:Cu3=1:\frac{1}{3}:\frac{1}{5}=:15:5:3 \quad (1)$$

"ΔQ1" indicates a charge difference obtained by subtracting a charge stored in the second capacitor C2 from a charge stored in the first capacitor C1 of the first square-wave multiplier U1 in the charging process, and "ΔQ1 (3fs)" indicates a component of the charge difference ΔQ1 corresponding to a product of the third-order harmonic component (frequency 3fs) of the first square wave W1 and the input signal Vi. Also, "ΔQ1 (5fs)" indicates a component of the charge difference ΔQ1 corresponding to a product of the fifth-order harmonic component (frequency 5fs) of the first square wave W1 and the input signal Vi.

"ΔQ2" indicates a charge difference obtained by subtracting a charge stored in the second capacitor C2 from a charge stored in the first capacitor C1 of the second square-wave multiplier U2 in the charging process, and "ΔQ2 (3fs)" indicates a component of the charge difference ΔQ2 corresponding to a product of the fundamental component (frequency 3fs) of the second square wave W2 and the input signal Vi.

"ΔQ3" indicates a charge difference obtained by subtracting a charge stored in the second capacitor C2 from a charge stored in the first capacitor C1 of the second square-wave multiplier U3 in the charging process, and "ΔQ3 (3 fs)" indicates a component of the charge difference ΔQ3 corresponding to a product of the fundamental component (frequency 5 fs) of the second square wave W3 and the input signal Vi.

When the capacitance of the capacitors (C1 and C2) of the respective square-wave multipliers is set as indicated by formula (1), the components of the charge differences described above satisfy the following relationships.

$$\Delta Q1(3fs)=-\Delta Q2(3fs) \quad (2)$$

$$\Delta Q1(5fs)=-\Delta Q3(5fs) \quad (3)$$

However, the phase relationship between the first square wave W1 and the second square wave W2 is set such that the third-order harmonic component of the first square wave W1 and the fundamental component of the second square wave W2 are in opposite phases. Also, the phase relationship between the first square wave W1 and the second square wave W3 is set such that the fifth-order harmonic component of the first square wave W1 and the fundamental component of the second square wave W3 are in opposite phases.

Because the relationships represented by formulas (2) and (3) are satisfied, when the charge differences ΔQ1, ΔQ2, and ΔQ3 obtained during the charging process are combined by the signal combiner 10 in the charge output process, the component ΔQ1 (3fs) corresponding to the product of the third-order harmonic component of the first square wave W1 and the input signal Vi is offset by the component ΔQ2 (3fs) corresponding to the product of the fundamental component of the second square wave W2 and the input signal Vi. Also, the component ΔQ1 (5fs) corresponding to the product of the fifth-order harmonic component of the first square wave W1 and the input signal Vi is offset by the component ΔQ3 (5fs) corresponding to the product of the fundamental component of the second square wave W3 and the input signal Vi. That is, signal components resulting from the third-order harmonic component and the fifth-order harmonic component of the first square wave W1 are removed by adding the signal components to signal components output from the second square-wave multipliers U2 and U3.

The signal combiner 10 adjusts the voltage of the third common node N3 and the voltage of the fourth common node N4 so that the voltage of the first common node N1 and the voltage of the second common node N2 become equal to each other. The signal combiner 10 outputs a difference between the voltages of the third common node N3 and the fourth common node N4 as a signal Vo that correspond to a result of combining the charges output from the three square-wave multipliers (U1 through U3) in the charge output process.

In the example of FIG. 5, the signal combiner 10 includes an operational amplifier 11, a fourth switch circuit 12, and a fifth switch circuit 13.

The operational amplifier 11 amplifies a voltage difference between an inverting input terminal connected to the first common node N1 and a non-inverting input terminal connected to the second common node N2, and outputs the amplified voltage difference as a voltage difference between a non-inverting output terminal connected to the third common node N3 and an inverting output terminal connected to the fourth common node N4, i.e., as the signal Vo.

The fourth switch circuit 12 is provided in a path between the inverting input terminal and the non-inverting output terminal of the operational amplifier 11. The fourth switch circuit 32 is turned on in the charging process and is turned off in the charge output process of the square-wave multiplier U. As exemplified by FIG. 5, the fourth switch circuit 12 includes a switch element S8 connected between the inverting input terminal and the non-inverting output terminal of the operational amplifier 11.

The fifth switch circuit 13 is provided in a path between the non-inverting input terminal and the inverting output terminal of the operational amplifier 11. The fifth switch circuit 13 is turned on in the charging process and is turned off in the charge output process of the square-wave multiplier U. As exemplified by FIG. 5, the fifth switch circuit 13 includes a switch element S9 connected between the non-inverting input terminal and the inverting output terminal of the operational amplifier 11.

Here, operations of the sine-wave multiplier with the above configuration are described.

Figure 6A:
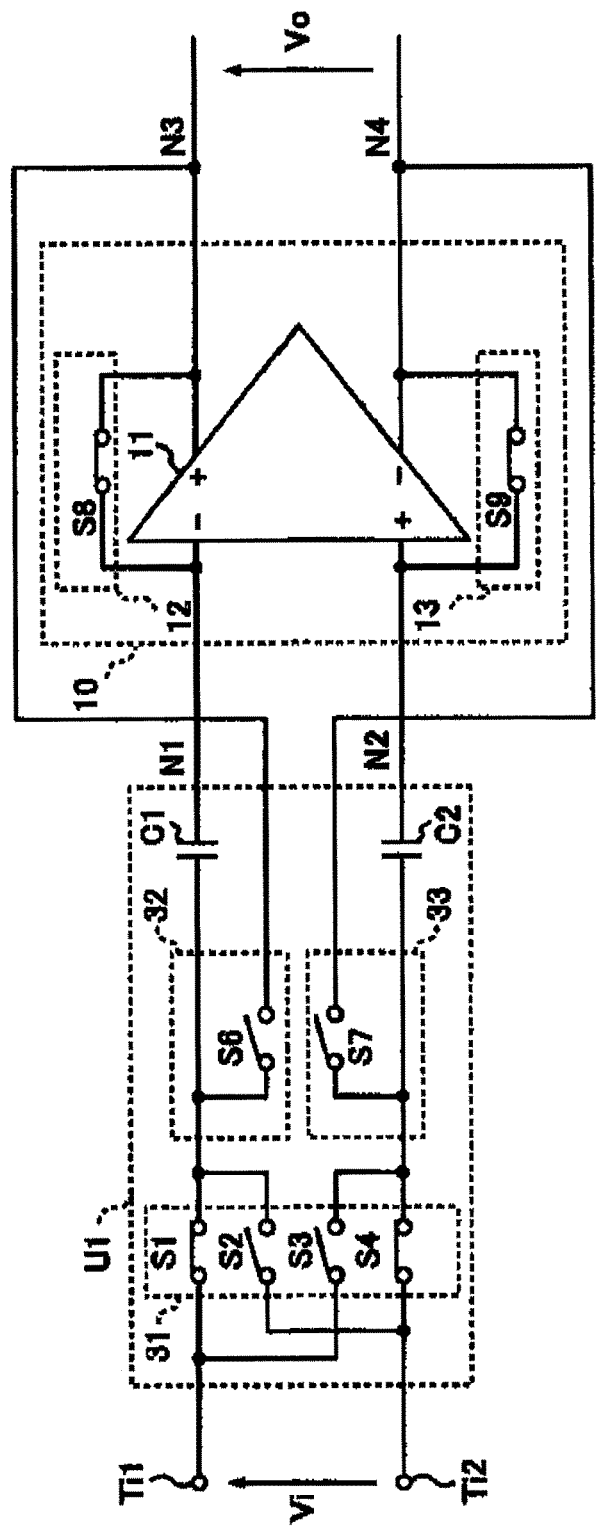
FIG. 6A illustrates states of switch elements during a charging process.
Figure 6B:
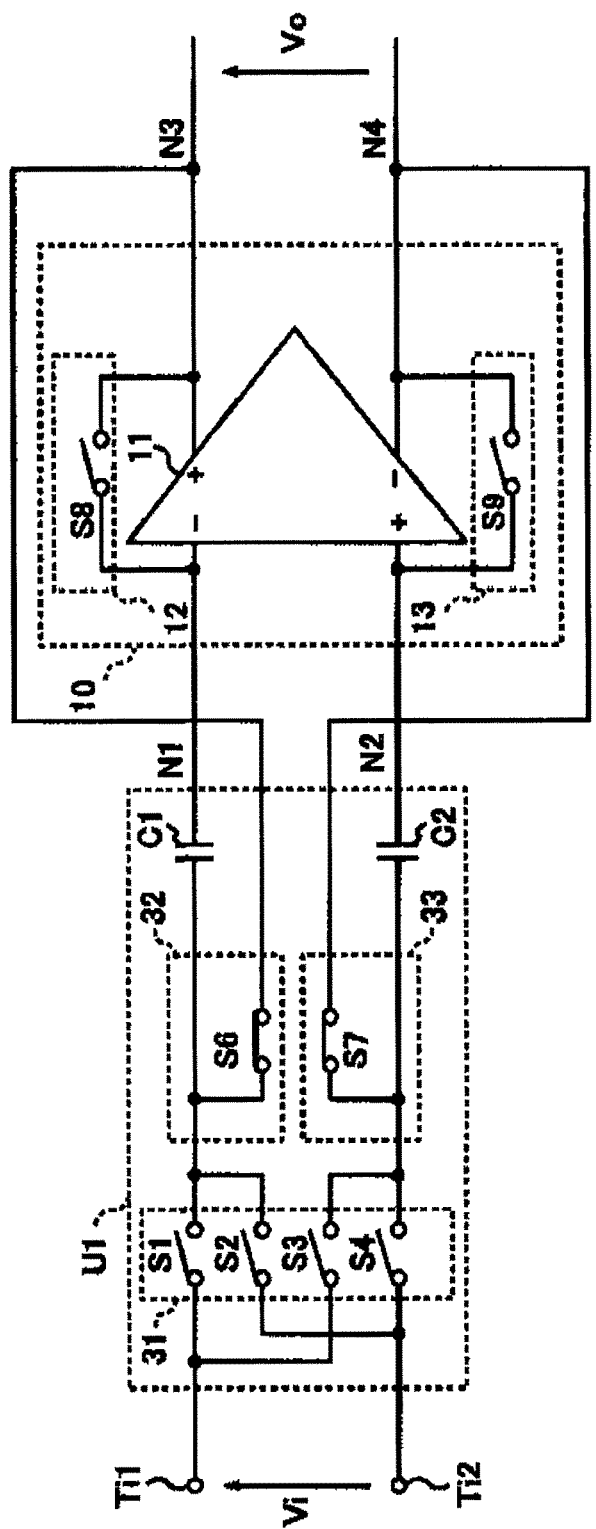
FIG. 6B illustrates states of switch elements during a charge output process.

FIGS. 6A and 6B are drawings used to describe states of switch elements during the charging process and the charge output process of the sine-wave multiplier illustrated by FIG. 5. FIG. 6A illustrates states of switch elements during the charging process, and FIG. 6B illustrates states of switch elements during the charge output process.

In FIGS. 6A and 6B, only the first square-wave multiplier U1 is illustrated as an example. However, the states of the switch elements in the charging process and the charge output process illustrated in FIGS. 6A and 6B are also applicable to the second square-wave multipliers U2 and U3.

In the charging process, as illustrated in FIG. 6A, the first capacitor C1 is connected between the first input terminal Ti1 and the first common node N1, and the second capacitor C2 is connected between the second input terminal Ti2 and the first common node N1. In this case, the fourth switch circuit 12 and the fifth switch circuit 13 are turned on and due to the negative feedback of the operational amplifier 11, the voltages of the first common node N1 and the second common node N2 become substantially equal.

When "Vi" indicates a voltage difference obtained by subtracting a voltage of the second input terminal Ti2 from a voltage of the first input terminal Ti1, and "C" indicates capacitance of the first capacitor C1 and the second capacitor C2, a charge difference ΔQ1 between the first capacitor C1 and the second capacitor C2 of the first square-wave multiplier U1, a charge difference ΔQ2 between the first capacitor C1 and the second capacitor C2 of the second square-wave multiplier U2, and a charge difference ΔQ3 between the first capacitor C1 and the second capacitor C2 of the second square-wave multiplier U3 during the charging process are represented by the following formulas.

$$\Delta Q1 = \pm Vi \times C \quad (4)$$

$$\Delta Q2 = \pm Vi \times (C/3) \quad (5)$$

$$\Delta Q3 = \pm Vi \times (C/5) \quad (6)$$

The sign on the right-hand side of formula (4) is switched every half cycle of the first square wave W1 (frequency fs). The sign on the right-hand side of formula (5) is switched every half cycle of the second square wave W2 (frequency 3fs). The sign on the right-hand side of formula (6) is switched every half cycle of the second square wave W3 (frequency 5fs).

In the charge output process, as illustrated in FIG. 6B, the second terminal of the first capacitor C1 is connected to the third common node N3. As a result, the first capacitor C1 of the first square-wave multiplier U1 is connected between the first common node N1 and the third common node N3 in parallel with the first capacitor C1 of the second square-wave multiplier U2 and the first capacitor C1 of the second square-wave multiplier U3. The charges stored in the first capacitors C1 of the square-wave multipliers (U1 through U3) in the charging process are directly combined when the first capacitors C1 are connected in parallel with each other in the charge output process.

In the charge output process, as illustrated in FIG. 6B, the second terminal of the second capacitor C2 is connected to the fourth common node N4. As a result, the second capacitor C2 of the first square-wave multiplier U1 is connected between the second common node N2 and the fourth common node N4 in parallel with the second capacitor C2 of the second square-wave multiplier U2 and the second capacitor C2 of the second square-wave multiplier U3. The charges stored in the second capacitors C2 of the square-wave multipliers (U1 through U3) in the charging process are directly combined when the second capacitors C2 are connected in parallel with each other in the charge output process.

When "ΔQS" indicates a charge difference obtained by subtracting the total charge of the three parallel-connected second capacitors C2 from the total charge of the three parallel-connected first capacitors C1 combined in the charge output process, the charge difference ΔQS is represented by the following formula.

$$\Delta QS = \Delta Q1 + \Delta Q2 + \Delta Q3 \quad (7)$$

Because the combined capacitance of the three first capacitors C1 connected in parallel with each other in the charge output process is substantially the same as the combined capacitance of the three second capacitors C2, the output signal Vo of the operational amplifier 11 is proportional to the charge difference ΔQS. Also, as indicated by formula (7), the charge difference ΔQS is the sum of charge differences ΔQ1, ΔQ2, and ΔQ3 represented by formulas (4) through (6). Accordingly, the charge difference ΔQS is proportional to the input signal Vi. For this reason, the output signal Vo of the operational amplifier 11 increases and decreases substantially in proportion to the input signal Vi.

Also, according to the relationships indicated by formulas (2) and (3), harmonic components (the third-order harmonic component and the fifth-order harmonic component) of the charge difference ΔQ1 are removed from the charge difference ΔQS that is the sum of the charge differences ΔQ1, ΔQ2, and ΔQ3. Accordingly, in the output signal Vo of the operational amplifier 11, a signal component corresponding to the product of the input signal Vi and a sine wave (frequency fs) becomes dominant, and signal components corresponding to the products of the input signal Vi and harmonic components (frequencies 3fs and 5fs) become small.

FIG. 7 is a timing chart illustrating states of switch elements of the sine-wave multiplier according to the second embodiment. In the timing chart of FIG. 7, a high level indicates that a switch element is ON and a low level indicates that a switch element is OFF.

In the example of FIG. 7, switch elements (switch elements S1 through S4, S8, and S9; and switch elements S6 and S7), which are alternately turned on, are controlled such that their ON states do not overlap each other and cross talk due to a delay in ON/OFF operations can be prevented.

Also in the example of FIG. 7, each of the charging operation and the charge output operation is performed once in each period T. One cycle (1/fs) of the first square wave W1 is set at 60 periods T (60T), one cycle (⅓fs) of the second square wave W2 is set at 20 periods T (20T), and one cycle (⅕fs) of the second square wave W3 is set at 12 periods T (12T).

The number of periods T defining the half cycle of the first square wave W1 (30 cycles in the example of FIG. 7) is set at a common multiple of magnifications (3 and 5), which are relative to the frequency fs of the fundamental component, of the frequencies (3fs and 5fs) of harmonic components of the first square wave W1 to be offset by the outputs of the second square-wave multipliers (U2 and U3). In the sine-wave multiplier of FIG. 5, the third-order harmonic component and the fifth-order harmonic component of the first square wave W1 are to be offset. Therefore, "30", which is a common multiple of "3" and "5", is set as the number of periods T defining the half cycle of the first square wave W1. Determining the number of periods T for the half cycle of the first square wave W1 as described above makes it possible to set an integer as the number of periods T for the half cycle of each of the second square waves W2 and W3. This in turn makes it possible to accurately set the ratio between the cycle of the first square wave W1 and the cycle of each of the second square waves W2 and W3 based on the number of periods T.

Here, an operation mode where the signs on the right-hand side of formulas (4), (5), and (6) become "positive" is referred to as a "normal mode", and an operation mode where the signs on the right-hand side of formulas (4), (5), and (6) become "negative" is referred to as a "reverse mode". As illustrated in FIG. 7, the square-wave multipliers (U1 through U3) are in the "normal mode" in a half cycle in each cycle of the square wave, and in the "reverse mode" in another half cycle. In the "normal mode", the switch elements S1 and S4 of the first switch circuit 31 are turned on and the switch elements S2 and S3 are turned off during the charging process. In the "reverse mode", the switch elements Si and S4 of the first switch circuit 31 are turned off and the switch elements S2 and S3 are turned on during the charging process.

In the first square-wave multiplier U1, the normal-mode operation is repeated 30 times in the first half cycle (30T) of the first square wave W1, and the reverse-mode operation is repeated 30 times in the second half cycle (30T) of the first square wave W1.

In the second square-wave multiplier U2, the reverse-mode operation is repeated 10 times in the first half cycle (10T) of the second square wave W2, and the normal mode operation is repeated 10 times in the second half cycle (10T) of the second square wave W2. The reverse-mode operation is started in the second square-wave multiplier U2 when the normal mode operation is started in the first square-wave multiplier U1. Therefore, the fundamental component of the second square wave W2 has a phase that is opposite the phase of the third-order harmonic component of the first square wave W1.

In the second square-wave multiplier U3, the reverse-mode operation is repeated 6 times in the first half cycle (6T) of the second square wave W3, and the normal mode operation is repeated 6 times in the second half cycle (6T) of the second square wave W3. The reverse-mode operation is started in the second square-wave multiplier U3 when the normal mode operation is started in the first square-wave multiplier U1. Therefore, the fundamental component of the second square wave W3 has a phase that is opposite the phase of the fifth-order harmonic component of the first square wave W1.

Also, as illustrated in FIG. 7, the switch elements (S8 and S9) of the fourth switch circuit 12 and the fifth switch circuit 13 are turned on in the charging process and turned off in the charge output process. Also, the switch elements (S6 and S7) of the second switch circuit 32 and the third switch circuit 33 are turned off in the charging process and turned on in the charge output process. With this configuration, the three square-wave multipliers (U1 through U3) sample charge differences (ΔQ1, ΔQ2, ΔQ3) proportional to the input signal Vi in each charging process, and the signal combiner 10 combines the charge differences (ΔQ1, ΔQ2, ΔQ3) from the three square-wave multipliers (U1 through U3) and retains the combined result in each charge output process. A subsequent circuit (not shown) for processing the output signal Vo from the signal combiner 10 performs processes such as low-pass filtering and analog-to-digital conversion on the output signal Vo retained during the charge output process.

As described above, in the sine-wave multiplier of the second embodiment, the square-wave multiplier U multiplies the input signal Vi by the square wave W by repeating the charging process and the charge output process of the capacitors (C1 and C2) at regular intervals and inverting the polarity of charges output in the charge output process every half cycle of the square wave W. This configuration makes it possible to precisely set the cycle and the phase of a square wave in the square-wave multiplier U based on the number of periods T.

Also, with the sine-wave multiplier of the second embodiment, because the capacitance ratios of capacitors of the square-wave multipliers U are not readily influenced by variations in temperature and manufacturing processes, it is possible to accurately set the amplitude ratios of the square waves W for multiplying the input signal Vi in the square-wave multipliers U. Accordingly, with the sine-wave multiplier of the second embodiment, it is possible to accurately offset signal components (charges) corresponding to the products of harmonic components of the first square wave W1 and the input signal Vi included in the output signal of the first square-wave multiplier U1 by signal components (charges) corresponding to the products of the fundamental components of the second square waves W2 and W3 and the input signal Vi included in the output signals of the second square-wave multipliers U2 and U3.

Further, in the sine-wave multiplier of the second embodiment, multiplication by a square wave is performed based on a charge difference corresponding to the differential signal (Vi) in each of the three square-wave multipliers (U1 through U3), and charge differences (ΔQ1 through ΔQ3) obtained as the results of multiplication are combined by the signal combiner to obtain a signal Vo corresponding to the product of the differential signal (Vi) and a sine wave. This configuration makes it easier to remove common-mode noise superposed on each differential signal and thereby makes it possible to improve the anti-noise property.

Also, in the sine-wave multiplier of the second embodiment, the charges stored in the capacitors (C1 and C2) of the square-wave multipliers U are directly combined by connecting the capacitors in parallel with each other by the signal combiner 10. With this configuration, charge and discharge currents of the capacitors (C1 and C2) almost do not flow through the operational amplifier 11. That is, the speed of current drive at the operational amplifier 11 does not greatly influence the combination of charges by the signal combiner 10. This in turn makes it possible to combine charges at the signal combiner 10 at high speed without being limited by the speed of the operational amplifier 11, and thereby makes it possible to perform multiplication by a sine wave at high speed.

Third Embodiment

Next, a third embodiment of the present invention is described.

Figure 8:
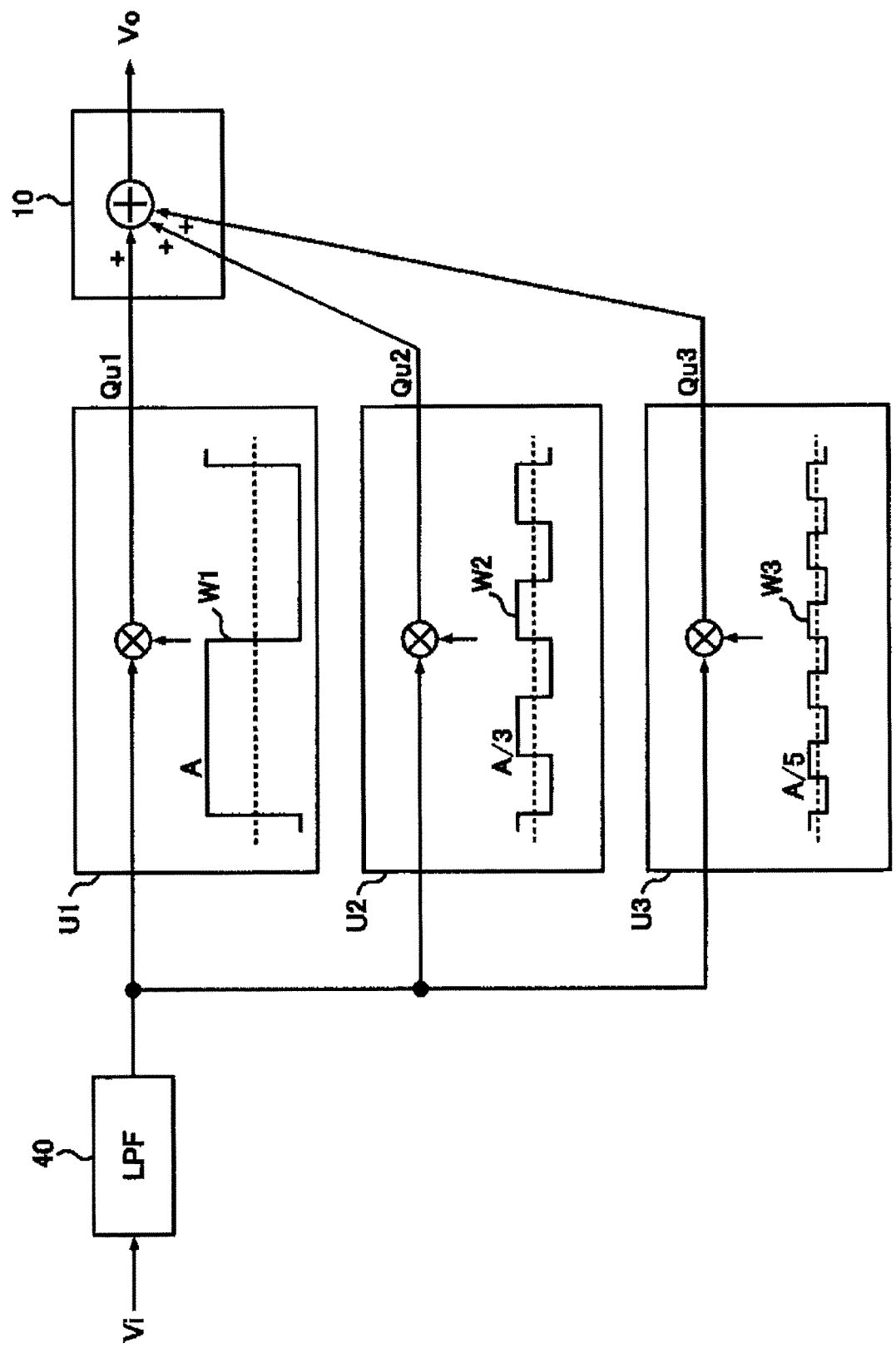
FIG. 8 is a drawing illustrating an example of a configuration of a sine-wave multiplier according to a third embodiment.

FIG. 8 is a drawing illustrating an example of a configuration of a sine-wave multiplier according to the third embodiment. The sine-wave multiplier of FIG. 8 has a configuration that is substantially the same as the configuration of the sine-wave multiplier of the first and second embodiments (FIGS. 4 and 5) except that a first low-pass filter 40 is added.

In the sine-wave multiplier of the first and second embodiments, the input signal Vi is discretely processed by the square-wave multipliers (U1 through U3), and therefore aliasing noise may be generated in the output signals of the square-wave multipliers (U1 through U3). The first low-pass filter 40 is provided to reduce the aliasing noise and attenuates high-frequency components of the input signal Vi input to the square-wave multipliers. That is, the first low-pass filter 40 attenuates a noise component included in the input signal Vi. The noise component has a frequency that is an integral multiple of the frequency (1/T) at which the charging process is repeated and may generate aliasing noise in the signal band of the input signal Vi. This makes it possible to prevent aliasing noise in the signal band of the input signal Vi and perform an accurate multiplication process even when the input signal Vi includes noise with a comparatively-high frequency.

In the sine-wave multipliers of the above embodiments, components resulting from the third-order harmonic component and the fifth-order harmonic component of the first square wave W1 (harmonic components x input signal Vi) are canceled by combining the outputs of the square-wave multipliers (U1 through U3). However, because the first square wave W1 also includes other harmonic components that are not canceled, components resulting from those harmonic components may remain in the output signal Vo. Particularly, the seventh-order harmonic component with an amplitude that is next largest to the fifth-order harmonic component may influence the accuracy of the multiplication result.

Also, as illustrated in FIG. 3, not only the fundamental components but also the harmonic components of the second square waves W2 and W3 (FIG. 3 (B) and FIG. 3 (C)) become equal to some of the harmonic components of the first square wave W1 (FIG. 3 (A)). In the example of FIG. 3, the third-order harmonic component and the fifth-order harmonic component of the second square wave W2 become equal to the ninth-order harmonic component and the 15th-order harmonic component of the first square wave W1. Also, the third-order harmonic component of the second square wave W3 become equal to the 15th-order harmonic component of the first square wave W1. Accordingly, the 15th-order harmonic component of the first square wave W1 is offset by both of the second square wave W2 and the second square wave W3, which results in an error.

The first low-pass filter 40 attenuates high-frequency components of the input signal Vi before the input signal Vi is input to the square-wave multipliers (U1 through U3), and therefore can reduce the influence of errors resulting from the products of harmonic components and the input signal Vi. The lowest harmonic component that has a possibility of affecting the accuracy is the seventh-order harmonic component (frequency 7fs) of the first square wave W1. Therefore, the frequency characteristic of the first low-pass filter 40 may be set, for example, to attenuate components with frequencies higher than the frequency 7fs to such an extent that the components do not influence the multiplication accuracy.

Figure 9:
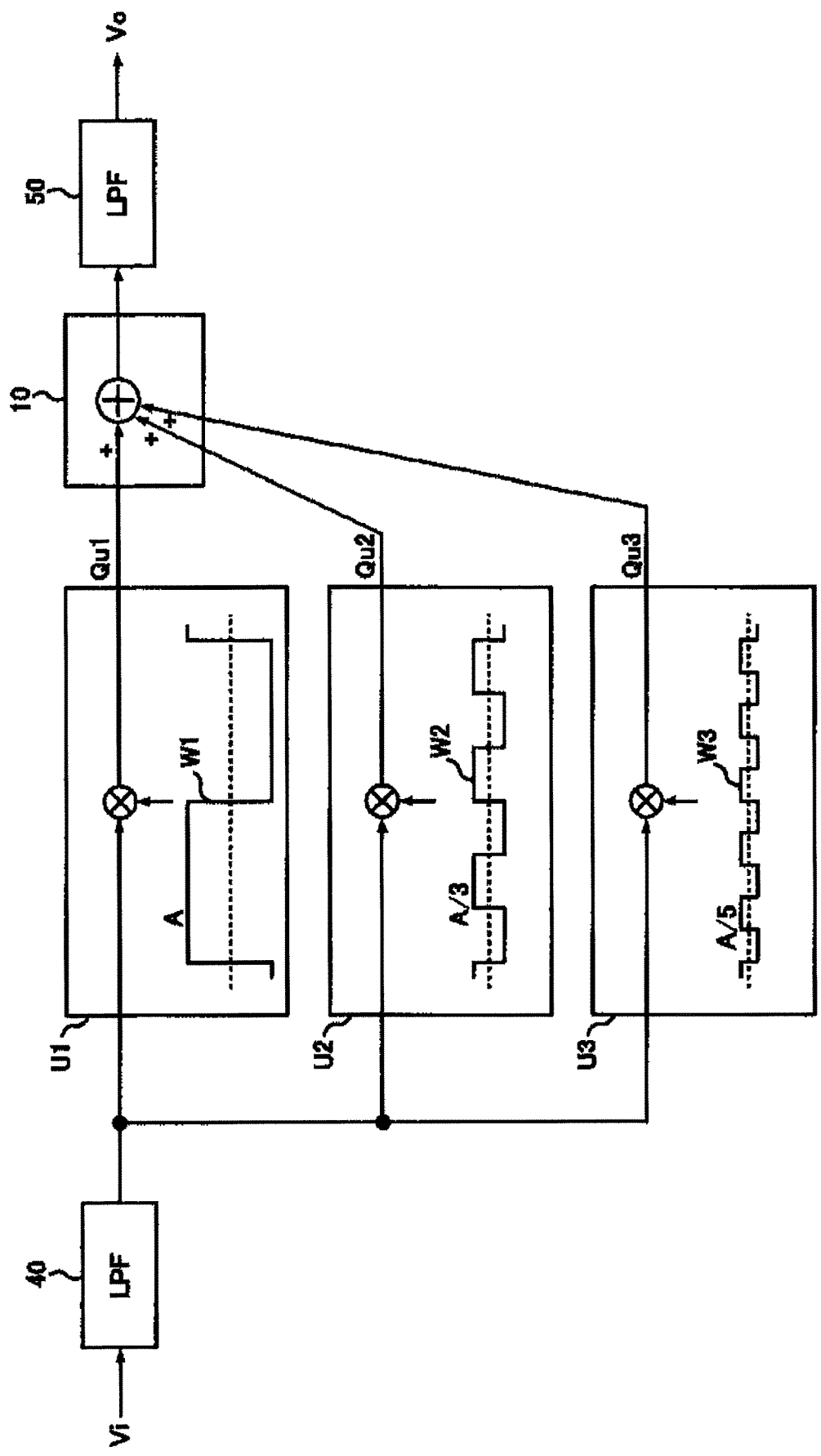
FIG. 9 is a drawing illustrating another example of a configuration of a sine-wave multiplier according to the third embodiment.

FIG. 9 is a drawing illustrating another example of a configuration of a sine-wave multiplier according to the third embodiment. The sine-wave multiplier of FIG. 9 has a configuration that is substantially the same as the configuration of the sine-wave multiplier of FIG. 8 except that a second low-pass filter 50 is added.

The sine-wave multiplier of FIG. 9 may be configured to function as a circuit (narrow-band pass filter circuit) that extracts only a signal component with the frequency fs included in the input signal Vi. In this case, the second low-pass filter 50 is configured to extract a direct-current component of the output signal Vo such that the level of the direct-current component corresponds to the amplitude of the signal component with the frequency fs included in the input signal Vi. The second low-pass filter 50 is implemented by, for example, a digital filter that discretely processes the result of the analog-to-digital conversion of the output signal Vo.

Fourth Embodiment

Next, a fourth embodiment of the present invention is described.

Figure 10:
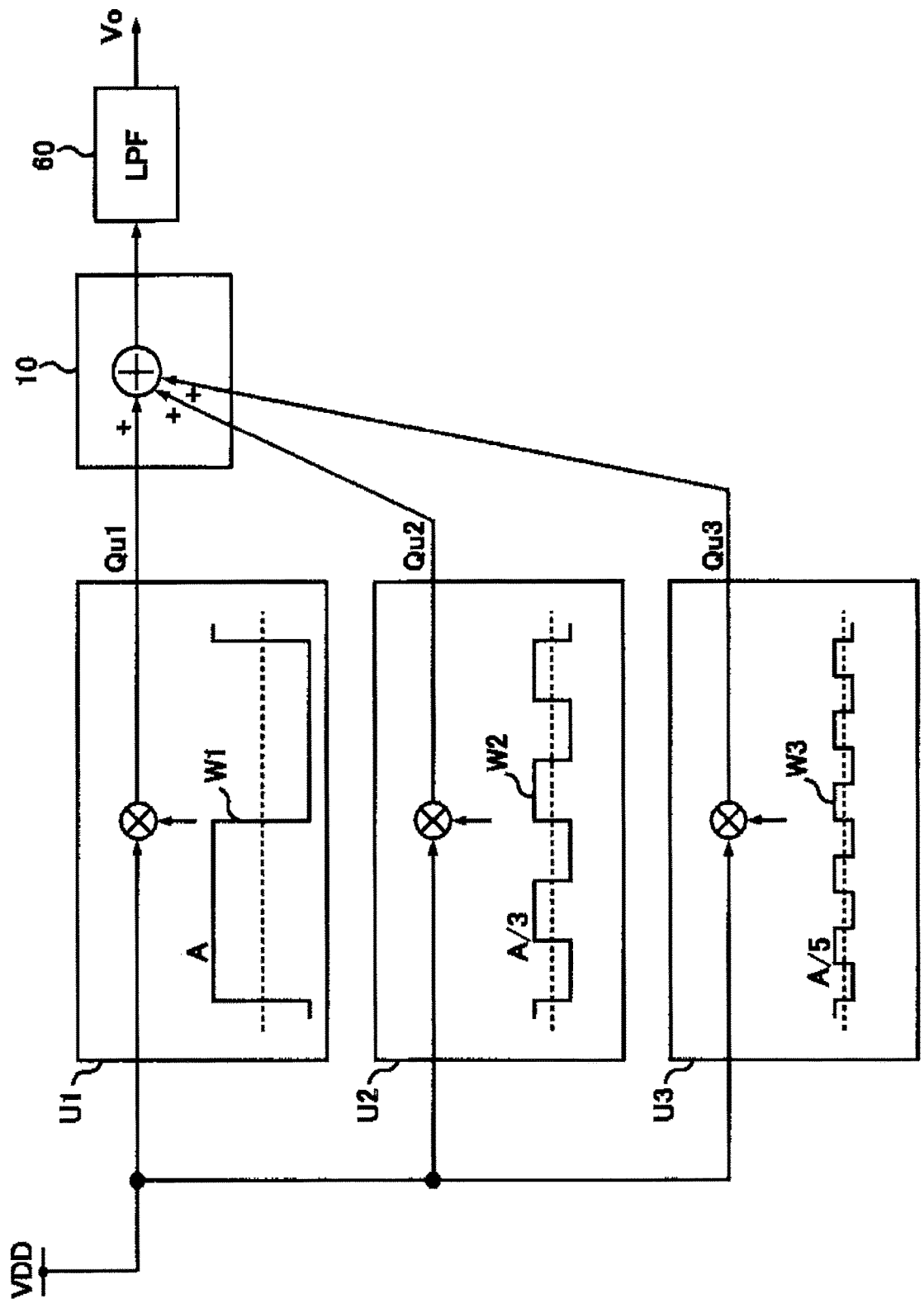
FIG. 10 is a drawing illustrating an example of a configuration of a sine-wave multiplier according to a fourth embodiment.

FIG. 10 is a drawing illustrating an example of a configuration of a sine-wave multiplier according to the fourth embodiment.

The sine-wave multiplier of FIG. 10 has a configuration that is substantially the same as the configuration of the sine-wave multiplier of the first and second embodiments (FIGS. 4 and 5) except that a third low-pass filter 60 is added and the input signal Vi is replaced by a direct-current voltage VDD.

In the sine-wave multiplier of FIG. 10, because the input signal Vi is replaced by the direct-current voltage VDD, the output signal Vo is a signal obtained by multiplying the direct-current voltage VDD by a sine wave, i.e., a sine wave itself. The sine-wave multiplier of FIG. 8 converts a signal component with the frequency fs into a direct-current component. In contrast, the sine-wave multiplier of FIG. 10 generates a signal with the frequency fs from the direct-current component. Thus, the sine-wave multipliers of FIGS. 8 and 10 have opposite input-output relationships. Accordingly, similarly to the sine-wave multiplier of FIG. 8, the third low-pass filter 60 attenuates components with frequencies higher than the lowest harmonic component (the seventh-order harmonic component) that has a possibility of affecting the accuracy.

Thus, the sine-wave multiplier of the fourth embodiment can be configured to function as a high-precision sine-wave generating circuit.

Fifth Embodiment

Next, an input device according to a fifth embodiment of the present invention is described below with reference to FIG. 11.

Figure 11:
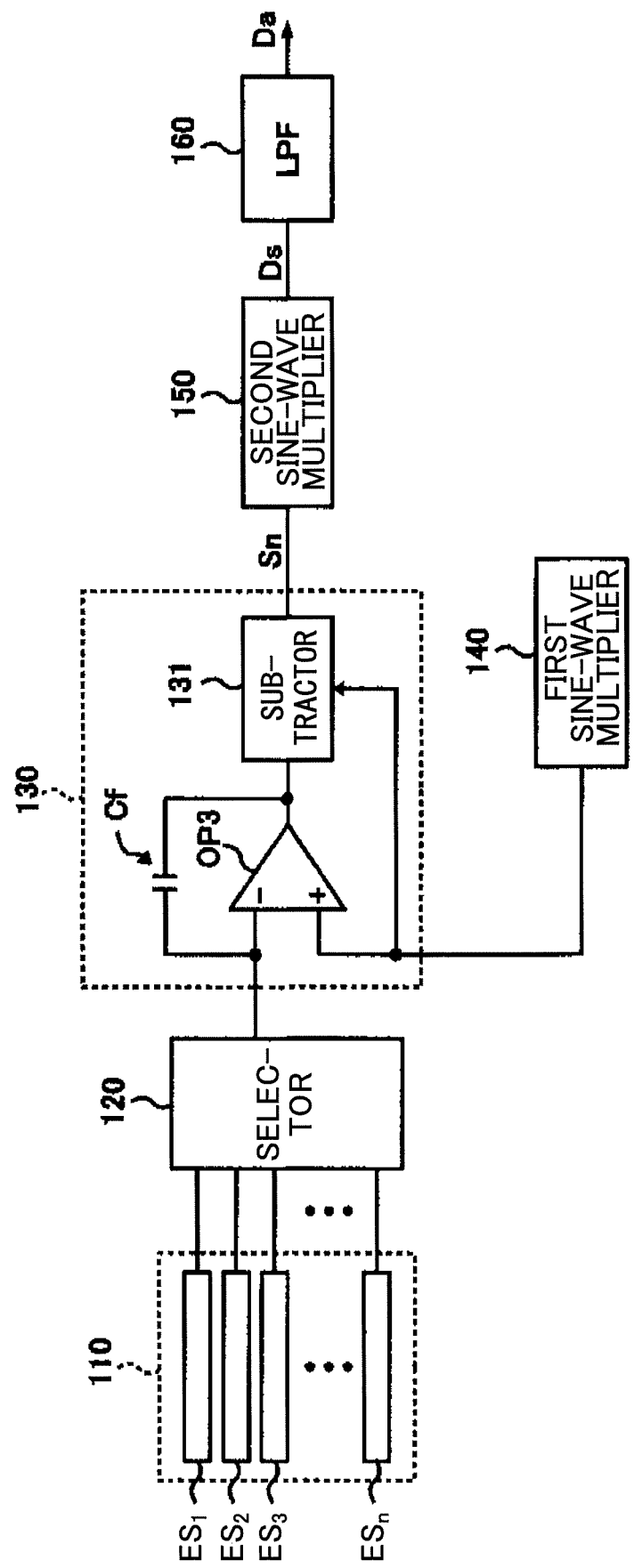
FIG. 11 is a drawing illustrating an example of, a configuration of an input device according to a fifth embodiment.

The input device of the fifth embodiment illustrated by FIG. 11 is, for example, a touch sensor that inputs information corresponding to the approach of an object, and includes a sensor 110, a selector 120, a detection signal generator 130, a first sine-wave multiplier 140, a second sine-wave multiplier 150, and a low-pass filter 160.

The sensor 110 includes sensor elements whose capacitance changes as an object approaches the sensor elements. In the example of FIG. 11, the sensor 110 includes electrodes ES1 through ESn that form capacitors with an object. When an object (e.g., a fingertip) approaches the electrodes ES1 through ESn, the capacitance of capacitors formed between the electrodes ES1 through ESn and the object changes.

The selector 120 selects an electrode from the electrodes ES1 through ESn of the sensor 110 and connects the selected electrode to an input of the detection signal generator 130.

The detection signal generator 130 applies a sine-wave drive voltage corresponding to a first sine wave supplied from the first sine-wave multiplier 140 to the electrode (one of ES1 through ESn) of the sensor 110 selected by the selector 120, and generates a detection signal Sn corresponding to a current that flows through the electrode due to the application of the drive voltage. As exemplified by FIG. 11, the detection signal generator 130 includes an operational amplifier OP3, a capacitor Cf, and a subtractor 131. The capacitor Cf is connected between the inverting input terminal and the output terminal of the operational amplifier OP3. The first sine wave is input from the first sine-wave multiplier 140 to the non-inverting input terminal of the operational amplifier OP3. The subtractor 131 subtracts the first sine wave from an output signal of the operational amplifier OP3 and outputs the subtraction result as the detection signal Sn. The detection signal Sn oscillates at a frequency fs that is the same as the frequency of the first sine wave. The amplitude of the detection signal Sn is proportional to the capacitance of the capacitor formed between the electrode of the sensor 110 and the object (fingertip).

The first sine-wave multiplier 140 multiplies a direct-current signal by a sine wave with the frequency fs, and outputs the first sine wave with a predetermined frequency as a result of the multiplication. For example, the first sine-wave multiplier 140 has a configuration similar to that of the sine-wave multiplier of FIG. 10.

The second sine-wave multiplier 150 multiplies the detection signal Sn generated by the detection signal generator 130 by a second sine wave with the frequency fs. For example, the second sine-wave multiplier 150 has a configuration similar to that of the sine-wave multiplier of FIG. 8.

The low-pass filter 160 extracts a direct-current component signal Da from a signal Ds obtained as a result of multiplication by the second sine-wave multiplier 150. The second sine-wave multiplier 150 and the low-pass filter 160 function as a narrow-band pass filter that extracts a signal component with the frequency fs included in the detection signal Sn. The direct-current component signal Da has a level corresponding to the amplitude of the signal component with the frequency fs included in the detection signal Sn and is proportional to the capacitance of the capacitor formed between the electrode of the sensor 110 and the object (fingertip).

With the input device of the fifth embodiment, it is possible to obtain a highly-accurate capacitance detection value from which the influence of exogenous noise is removed by using the first sine-wave multiplier 140 and the second sine-wave multiplier 150 having simple configurations.

Embodiments of the present invention are described above. However, the present invention is not limited to the specifically disclosed embodiments, and variations and modifications may be made.

Figure 12:
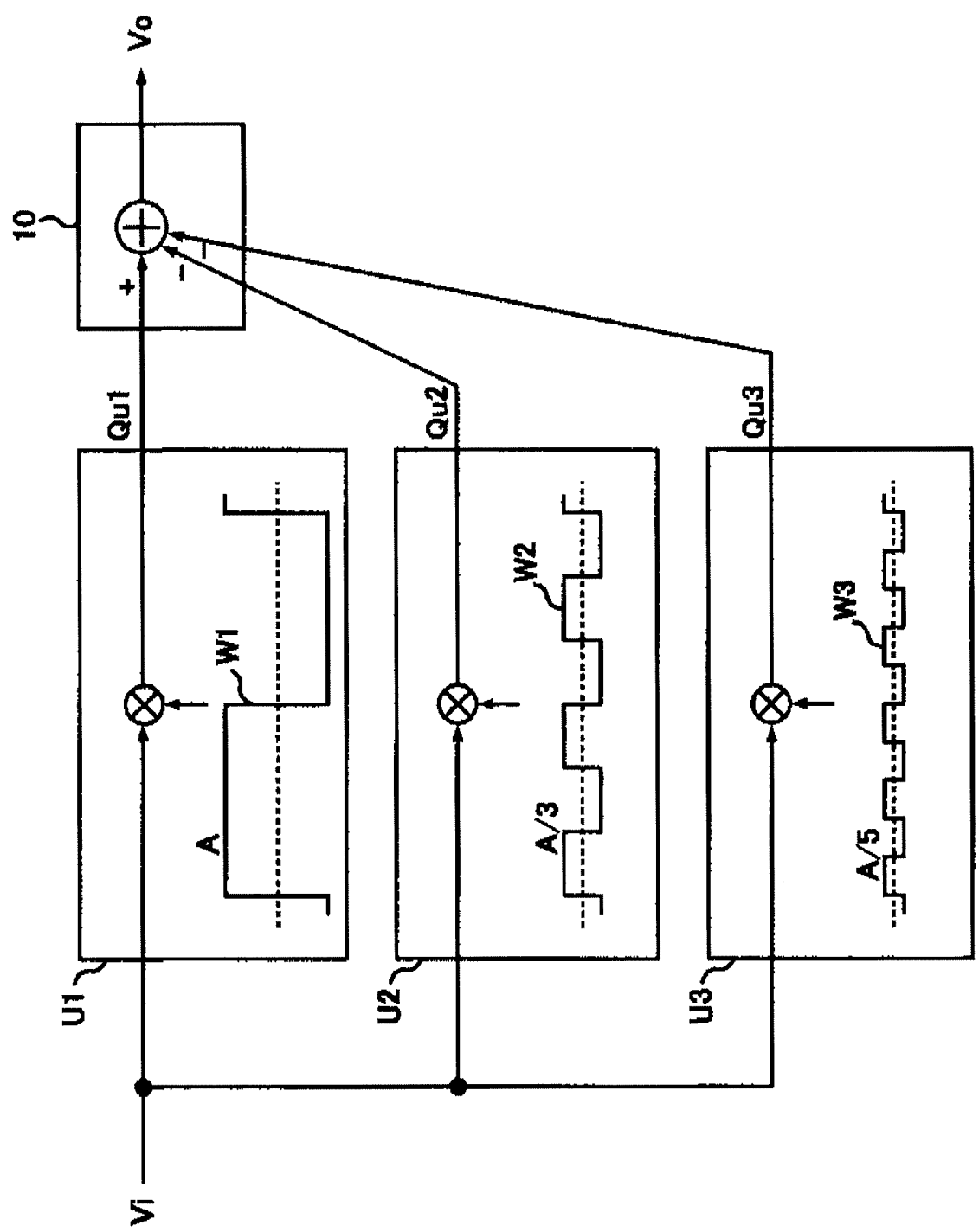
FIG. 12 is a drawing illustrating a configuration of a sine-wave multiplier according to a variation where fundamental components of square waves in second square-wave multipliers are in phase with harmonic components of a square wave in a first square-wave multiplier.

In the sine-wave multiplier of FIG. 4, the phase of the fundamental components of the second square waves W2 and W3 used by the second square-wave multipliers U2 and U3 to multiply the input signal Vi is the opposite of the phase of harmonic components of the first square wave W1. However, the present invention is not limited to this example. In another embodiment of the present invention, as exemplified by FIG. 12, the phase of the fundamental components of the second square waves W2 and W3 used by the second square-wave multipliers U2 and U3 to multiply the input signal Vi may be the same as the phase of harmonic components of the first square wave W1. In this case, the signal combiner 10 may be configured to combine signals by subtracting the output signals Qu2 and Qu3 of the second square-wave multipliers U2 and U3 from the output signal Qu1 of the first square-wave multiplier U1 so that the harmonic components can be canceled as in the case of the sine-wave multiplier of FIG. 4.

In the embodiments described above, signal components corresponding to the third-order harmonic component and the fifth-order harmonic component of the first square wave W1 are offset by signal components corresponding to the fundamental components of the second square waves W2 and W3. However, the present invention is not limited to this example. In another embodiment of the present invention, the number of square-wave multipliers may be greater than three so that signal components corresponding to harmonic components with higher frequencies can also be canceled.

In the embodiments described above, square-wave multiplication processes and multiplication-result combining processes are performed using analog circuits. However, these signal processes may instead be performed using digital circuits.

An aspect of this disclosure makes it possible to provide a sine-wave multiplier that has a simple configuration, can handle a wide range of input signal levels, and is less influenced by temperature variations.

A first aspect of the present invention provides a sine-wave multiplier that multiplies an input signal by a sine wave with a predetermined frequency. The sine-wave, multiplier includes a first input terminal and a second input terminal to which the input signal is input, square-wave multipliers that multiply the input signal by square waves with different frequencies, and a signal combiner that combines the multiplied input signals output from the square-wave multipliers. Each square wave is approximated by the sum of a fundamental component that is a sine wave with the lowest frequency and multiple harmonic components that are sine waves with frequencies that are integral multiples of the frequency of the fundamental component. The square-wave multipliers include a first square-wave multiplier that multiplies the input signal by a first square wave including a fundamental component that is the sine wave with the predetermined frequency, and at least one second square-wave multiplier that multiplies the input signal by a second square wave including a fundamental component that is a sine wave corresponding to one of harmonic components of the first square wave or a sine wave obtained by inverting the phase of the one of the harmonic components. The signal combiner offsets a signal component that is included in a multiplication result of the first square-wave multiplier and corresponds to a product of the input signal and the one of the harmonic components of the first square wave by a signal component that is included in a multiplication result of the second square-wave multiplier and corresponds to a product of the input signal and the fundamental component of the second square wave. Each of the square-wave multipliers includes two capacitors having the same capacitance and is configured to alternately repeat, at predetermined intervals, a charging process where charges having a difference corresponding to the input signal are stored in the two capacitors in each of a first half cycle and a second half cycle of each cycle of the square wave for multiplying the input signal and a charge output process where the charges stored in the two capacitors by the charging process are output to the signal combiner, and to invert, between the first half cycle and the second half cycle, a relationship between a polarity of the input signal in the charging process and a polarity of a difference between the charges output from the two capacitors to the signal combiner in the charge output process. The signal combiner is configured to combine the charges that are output from multiple sets of the two capacitors of the square-wave multipliers in the charge output process.

With the above configuration, a signal component included in an output signal of the first square-wave multiplier and corresponding to a product of the input signal and one of the harmonic components of the first square wave is offset by a signal component included in an output signal of the second square-wave multiplier and corresponding to a product of the input signal and the fundamental component of the second square wave. Accordingly, in the combined signal output from the operational amplifier, the signal component corresponding to the product of the input signal and the harmonic component of the first square wave decreases, and the signal component corresponding to the product of the input signal and the fundamental component (the sine wave with the predetermined frequency) of the first square wave becomes dominant.

In the sine-wave multiplier described above, the input signal is multiplied by a sine wave (the fundamental component of the first square wave) by using the square-wave multipliers. Unlike an analog multiplier, this configuration makes it possible to reduce the influence of temperature characteristics of transistors and reduce characteristic variations resulting from temperature changes. Also, unlike an analog multiplier, using the square-wave multipliers makes it possible to reduce the influence of input-output nonlinear characteristics of transistors and thereby makes it possible to increase the range of input signal levels.

Further, using the square-wave multipliers makes it possible to omit a sine-wave generator and makes it possible to simplify the circuit configuration of the sine-wave multiplier.

Also with the above configuration, in each of the square-wave multipliers, the input signal is multiplied by the square wave based on a charge difference corresponding to the input signal, and charge differences obtained as the results of multiplications are combined by the signal combiner. This configuration makes it easier to remove common-mode noise and makes it possible to improve the anti-noise property.

Preferably, a ratio between the capacitance of the capacitors in the first square-wave multiplier and the capacitance of the capacitors in the second square-wave multiplier corresponds to a ratio between an amplitude of the fundamental component of the first square wave and an amplitude of the one of the harmonic components of the first square wave that has a frequency equal to a frequency of the fundamental component of the second square wave used by the second square-wave multiplier.

This configuration makes it possible to offset a signal component corresponding to a product of the input signal and one of the harmonic components of the first square wave by a signal component corresponding to a product of the input signal and the fundamental component of the second square wave based on a capacitance ratio between the capacitors of the first square-wave multiplier and the capacitors of the second square-wave multiplier. Because the capacitance ratio between capacitors is less likely affected by variations in temperature and manufacturing processes, the above configuration makes it possible to accurately offset signal components.

Preferably, the sine-wave multiplier according to the first aspect of the present invention may include a first common node, a second common node, a third common node, and a fourth common node to which the square-wave multipliers are commonly connected.

Each square-wave multiplier may include a first capacitor and a second capacitor having the same capacitance. The square-wave multiplier may be configured such that in the charging process, a voltage generated between the first common node and one of the first input terminal and the second input terminal is applied to the first capacitor, and a voltage generated between the second common node and another one of the first input terminal and the second input terminal is applied to the second capacitor; and in the charge output process, the first capacitor is connected between the first common node and the third common node, and the second capacitor is connected between the second common node and the fourth common node. Also, the square-wave multiplier may be configured to invert, between the first half cycle and the second half cycle, the relationship between the polarity of the input signal in the charging process and the polarity of a charge difference obtained by subtracting a charge stored in the second capacitor in the charging process from a charge stored in the first capacitor in the charging process.

The signal combiner may be configured to adjust the voltage of the third common node and the voltage of the fourth common node so that the voltage of the first common node and the voltage of the second common node become equal to each other. Also, the signal combiner may be configured to output a difference between the voltages of the third common node and the fourth common node as a signal corresponding to a result of combining the charges output from the square-wave multipliers in the charge output process.

Preferably, the square-wave multiplier may include a first capacitor that includes a first end connected to the first common node, a second capacitor that includes a first end connected to the second common node and has a capacitance that is the same as the capacitance of the first capacitor; a first switch circuit configured to connect a second end of the first capacitor to the first input terminal and connect a second end of the second capacitor to the second input terminal in the charging process in the first half cycle of each cycle of the square wave for multiplying the input signal, to connect the second end of the first capacitor to the second input terminal and connect the second end of the second capacitor to the first input terminal in the charging process in the second half cycle of each cycle of the square wave, and to disconnect the second end of the first capacitor and the second end of the second capacitor from the first input terminal and the second input terminal in the charge output process; a second switch circuit provided in a path between the second end of the first capacitor and the third common node and configured to be turned off in the charging process and turned on in the charge output process; and a third switch circuit provided in a path between the second end of the second capacitor and the fourth common node and configured to be turned off in the charging process and turned on in the charge output process.

In this case, the signal combiner may include an operational amplifier configured to amplify a voltage difference between an inverting input terminal connected to the first common node and a non-inverting input terminal connected to the second common node, and to output the amplified voltage difference as a voltage difference between a non-inverting output terminal connected to the third common node and an inverting output terminal connected to the fourth common node; a fourth switch circuit provided in a path between the inverting input terminal and the non-inverting output terminal of the operational amplifier and configured to be turned on in the charging process and turned off in the charge output process; and a fifth switch circuit provided in a path between the non-inverting input terminal and the inverting output terminal of the operational amplifier and configured to be turned on in the charging process and turned off in the charge output process.

Preferably, the sine-wave multiplier according to the first aspect of the present invention may also include a first low-pass filter that attenuates noise components included in the input signal to be input to the square-wave multipliers. The noise components have frequencies that are integral multiples of a frequency at which the charging process is repeated and possibly generate aliasing noise in a signal band of the input signal.

This configuration makes it possible to reduce aliasing noise in a signal generated by the signal combiner.

Preferably, in the sine-wave multiplier according to the first aspect of the present invention, the square-wave multipliers may include N square-wave multipliers that multiply the input signal by N patterns of the second square waves corresponding to first through Nth harmonic components in ascending order of frequency in the harmonic components of the first square wave. In this case, the first low-pass filter may be configured to attenuate the noise components of the input signal that have frequencies corresponding to (N+1)th and subsequent harmonic components in ascending order of frequency in the harmonic components of the first square wave.

This configuration makes it possible to reduce the chance that direct-current components corresponding to the products of the noise components of the input signal and the harmonic components in the first square wave are included in a combined signal output from the signal combiner.

Preferably, the sine-wave multiplier according to the first aspect of the present invention may also include a second low-pass filter that extracts a direct-current component from a combined signal output from the signal combiner.

This configuration makes it possible to extract a direct-current component corresponding to the amplitude of a frequency component of the sine wave included in the input signal.

Preferably, in the sine-wave multiplier according to the first aspect of the present invention, the square-wave multipliers may include N square-wave multipliers that multiply the input signal by N patterns of the second square waves corresponding to first through Nth harmonic components in ascending order of frequency in the harmonic components of the first square wave. The sine-wave multiplier may further include a third low-pass filter that attenuates components of a combined signal output from the signal combiner, the components having frequencies corresponding to (N+1)th and subsequent harmonic components in ascending order of frequency in the harmonic components of the first square wave. The input signal may be a direct-current signal.

This configuration makes it possible to obtain a sine wave as a combined signal output from the signal combiner and to reduce harmonic components of the first square wave included in the combined signal.

A second aspect of the present invention provides an input device that inputs information corresponding to approach of an object. The input device includes a sensor including a sensor element whose capacitance changes as the object approaches the sensor element, a first sine-wave multiplier that multiplies a direct-current signal by a sine wave with a predetermined frequency and outputs a first sine wave with the predetermined frequency as a result of the multiplication, a detection signal generator that applies a sine-wave drive voltage corresponding to the first sine wave to the sensor element and generates a detection signal corresponding to a current that is caused to flow through the sensor element by the application of the drive voltage, a second sine-wave multiplier that multiplies the detection signal by a second sine wave with the predetermined frequency, and a low-pass filter that extracts a direct-current component from the multiplied detection signal output from the second sine-wave multiplier. Each of the first sine-wave multiplier and the second sine-wave multiplier is implemented by the sine-wave multiplier according to the first aspect of the present invention.

What is claimed is:

1. A sine-wave multiplier that multiplies an input signal by a sine wave with a predetermined frequency, the sine-wave multiplier comprising:
    a first input terminal and a second input terminal to which a differential signal is input as the input signal;
    a plurality of square-wave multipliers that multiply the input signal by square waves with different frequencies; and
    a signal combiner that combines the multiplied input signals output from the square-wave multipliers, wherein
    each square wave of the square waves is approximated by a sum of a fundamental component that is a sine wave with a lowest frequency and multiple harmonic components that are sine waves with frequencies that are integral multiples of the frequency of the fundamental component;
    the square-wave multipliers include
        a first square-wave multiplier that multiplies the input signal by a first square wave including a fundamental component that is the sine wave with the predetermined frequency, and
        at least one second square-wave multiplier that multiplies the input signal by a second square wave including a fundamental component that is a sine wave corresponding to one of harmonic components of the first square wave or a sine wave obtained by inverting a phase of the one of the harmonic components;
    the signal combiner offsets a signal component that is included in a multiplication result of the first square-wave multiplier and corresponds to a product of the input signal and the one of the harmonic components of the first square wave by a signal component that is included in a multiplication result of the second square-wave multiplier and corresponds to a product of the input signal and the fundamental component of the second square wave;
    each of the square-wave multipliers includes two capacitors having same capacitance and is configured
        to alternately repeat, at predetermined intervals, a charging process where charges having a difference corresponding to the input signal are stored in the two capacitors in each of a first half cycle and a second half cycle of each cycle of the square wave for multiplying the input signal, and a charge output process where the charges stored in the two capacitors by the charging process are output to the signal combiner, and
        to invert, between the first half cycle and the second half cycle, a relationship between a polarity of the input signal in the charging process and a polarity of a difference between the charges output from the two capacitors to the signal combiner in the charge output process; and the signal combiner is configured to combine the charges that are output from multiple sets of the two capacitors of the square-wave multipliers in the charge output process.

2. The sine-wave multiplier as claimed in claim 1, wherein a ratio between the capacitance of the capacitors in the first square-wave multiplier and the capacitance of the capacitors in the second square-wave multiplier corresponds to a ratio between an amplitude of the fundamental component of the first square wave and an amplitude of the one of the harmonic components of the first square wave that has a frequency equal to a frequency of the fundamental component of the second square wave used by the second square-wave multiplier.

3. The sine-wave multiplier as claimed in claim 1, further comprising:

a first common node, a second common node, a third common node, and a fourth common node to which the square-wave multipliers are commonly connected, wherein each of the square-wave multipliers includes a first capacitor and a second capacitor having the same capacitance and is configured such that in the charging process, a voltage generated between the first common node and one of the first input terminal and the second input terminal is applied to the first capacitor, and a voltage generated between the second common node and another one of the first input terminal and the second input terminal is applied to the second capacitor, in the charge output process, the first capacitor is connected between the first common node and the third common node, and the second capacitor is connected between the second common node and the fourth common node, and a relationship between the polarity of the input signal in the charging process and a polarity of a charge difference obtained by subtracting a charge stored in the second capacitor in the charging process from a charge stored in the first capacitor in the charging process is inverted between the first half cycle and the second half cycle; and the signal combiner is configured to adjust a voltage of the third common node and a voltage of the fourth common node such that a voltage of the first common node and a voltage of the second common node become equal to each other, and to output a voltage difference between the third common node and the fourth common node as a signal corresponding to a result of combining the charges output from the square-wave multipliers in the charge output process.

4. The sine-wave multiplier as claimed in claim 1, further comprising:

a first common node, a second common node, a third common node, and a fourth common node to which the square-wave multipliers are commonly connected, wherein each of the square-wave multipliers includes a first capacitor that includes a first end connected to the first common node, a second capacitor that includes a first end connected to the second common node and has a capacitance that is a same as a capacitance of the first capacitor, a first switch circuit configured to connect a second end of the first capacitor to the first input terminal and connect a second end of the second capacitor to the second input terminal in the charging process in the first half cycle of each cycle of the square wave for multiplying the input signal, to connect the second end of the first capacitor to the second input terminal and connect the second end of the second capacitor to the first input terminal in the charging process in the second half cycle of each cycle of the square wave, and to disconnect the second end of the first capacitor and the second end of the second capacitor from the first input terminal and the second input terminal in the charge output process, a second switch circuit provided in a path between the second end of the first capacitor and the third common node and configured to be turned off in the charging process and turned on in the charge output process, and a third switch circuit provided in a path between the second end of the second capacitor and the fourth common node and configured to be turned off in the charging process and turned on in the charge output process; and the signal combiner includes an operational amplifier configured to amplify a voltage difference between an inverting input terminal connected to the first common node and a non-inverting input terminal connected to the second common node, and to output the amplified voltage difference as a voltage difference between a non-inverting output terminal connected to the third common node and an inverting output terminal connected to the fourth common node, a fourth switch circuit provided in a path between the inverting input terminal and the non-inverting output terminal of the operational amplifier and configured to be turned on in the charging process and turned off in the charge output process, and a fifth switch circuit provided in a path between the non-inverting input terminal and the inverting output terminal of the operational amplifier and configured to be turned on in the charging process and turned off in the charge output process.

5. The sine-wave multiplier as claimed in claim 1, further comprising:

a first low-pass filter that attenuates noise components included in the input signal to be input to the square-wave multipliers, wherein the noise components have frequencies that are integral multiples of a frequency at which the charging process is repeated and possibly generate aliasing noise in a signal band of the input signal.

6. The sine-wave multiplier as claimed in claim 5, wherein the square-wave multipliers include N square-wave multipliers that multiply the input signal by N patterns of the second square waves corresponding to first through Nth harmonic components in ascending order of frequency in the harmonic components of the first square wave; and the first low-pass filter attenuates the noise components of the input signal that have frequencies corresponding to (N+1)th and subsequent harmonic components in ascending order of frequency in the harmonic components of the first square wave.

7. The sine-wave multiplier as claimed in claim 1, further comprising:
a second low-pass filter that extracts a direct-current component from a combined signal output from the signal combiner.

8. The sine-wave multiplier as claimed in claim 1, wherein
the square-wave multipliers include N square-wave multipliers that multiply the input signal by N patterns of the second square waves corresponding to first through Nth harmonic components in ascending order of frequency in the harmonic components of the first square wave;
the sine-wave multiplier further comprises a third low-pass filter that attenuates components of a combined signal output from the signal combiner, the components having frequencies corresponding to (N+1)th and subsequent harmonic components in ascending order of frequency in the harmonic components of the first square wave; and
the input signal is a direct-current signal.

9. An input device that inputs information corresponding to approach of an object, the input device comprising:
a sensor including a sensor element whose capacitance changes as the object approaches the sensor element;
a first sine-wave multiplier that multiplies a direct-current signal by a sine wave with a predetermined frequency and outputs a first sine wave with the predetermined frequency as a result of the multiplication;
a detection signal generator that applies a sine-wave drive voltage corresponding to the first sine wave to the sensor element and generates a detection signal corresponding to a current that is caused to flow through the sensor element by the application of the drive voltage;
a second sine-wave multiplier that multiplies the detection signal by a second sine wave with the predetermined frequency; and
a low-pass filter that extracts a direct-current component from the multiplied detection signal
wherein each of the first sine-wave multiplier and the second sine-wave multiplier is implemented by the sine-wave multiplier of claim 1.

* * * * *